US008787022B2

(12) United States Patent
Moriai et al.

(10) Patent No.: US 8,787,022 B2
(45) Date of Patent: Jul. 22, 2014

(54) SEMICONDUCTOR STORAGE DEVICE AND METHOD OF MANUFACTURING THE SAME

(75) Inventors: Takakatsu Moriai, Kanagawa (JP); Toyokazu Eguchi, Tokyo (JP); Atsushi Kaneko, Kanagawa (JP); Atsushi Okada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 13/010,475

(22) Filed: Jan. 20, 2011

(65) Prior Publication Data

US 2011/0273834 A1 Nov. 10, 2011

Related U.S. Application Data

(63) Continuation-in-part of application No. 12/839,785, filed on Jul. 20, 2010.

(30) Foreign Application Priority Data

Jul. 24, 2009 (JP) .................... 2009-172942
Dec. 24, 2009 (JP) .................... 2009-293492
May 27, 2010 (JP) .................... 2010-121629

(51) Int. Cl.
H05K 7/20 (2006.01)

(52) U.S. Cl.
USPC .......... 361/720; 361/752; 361/762; 361/763; 174/260; 174/547; 174/548

(58) Field of Classification Search
USPC ................ 361/676, 688, 679.46, 679.54, 361/704–722, 748–752, 760–767, 777, 780, 361/783, 784
See application file for complete search history.

(56) References Cited

U.S. PATENT DOCUMENTS

| 6,853,559 | B2 * | 2/2005 | Panella et al. ................ 361/764 |
| 7,301,776 | B1 * | 11/2007 | Wang et al. ................... 361/737 |
| 7,330,354 | B2 * | 2/2008 | Watanabe ...................... 361/705 |
| 7,974,099 | B2 * | 7/2011 | Grajcar .......................... 361/720 |
| 8,111,194 | B2 * | 2/2012 | Chang et al. ........... 343/700 MS |
| 8,148,646 | B2 * | 4/2012 | Fan et al. ........................ 174/261 |
| 8,432,695 | B2 * | 4/2013 | Yoshikawa ..................... 361/709 |
| 2003/0194832 | A1 * | 10/2003 | Lopata et al. ................. 438/108 |
| 2004/0240174 | A1 | 12/2004 | Ooka et al. |
| 2006/0190634 | A1 * | 8/2006 | Bennett et al. ................. 710/15 |
| 2008/0123263 | A1 * | 5/2008 | Ueda ............................. 361/680 |
| 2009/0268390 | A1 * | 10/2009 | King et al. ............... 361/679.33 |
| 2010/0067166 | A1 * | 3/2010 | Furumura et al. ............ 361/270 |
| 2010/0073860 | A1 * | 3/2010 | Moriai et al. ............ 361/679.32 |
| 2011/0013365 | A1 * | 1/2011 | Oota ............................. 361/707 |

FOREIGN PATENT DOCUMENTS

| JP | 5-102359 | 4/1993 |
| JP | 2003-132668 | 5/2003 |
| JP | 2003-289124 | 10/2003 |
| JP | 2004-30837 | 1/2004 |
| JP | 2004-140146 | 5/2004 |
| JP | 2004-234440 | 8/2004 |
| JP | 2006-269505 | 10/2006 |

* cited by examiner

*Primary Examiner* — Courtney Smith
(74) *Attorney, Agent, or Firm* — Oblon, Spivak, McClelland, Maier & Neustadt, L.L.P.

(57) ABSTRACT

According to one embodiment, coupling capacitance in a state in which a first heat radiation member is arranged between parallel flat plates of a first capacitor formed by a surface of a housing opposed to one surface of a printed circuit board and the printed circuit board is smaller than coupling capacitance in a state in which an integrally formed object having a relative dielectric constant of 5.8 is arranged between the first capacitor to cover a first radiating region containing the controller and the first nonvolatile semiconductor memories.

16 Claims, 19 Drawing Sheets

| MEASUREMENT LOCATION | | TEMPERATURE MEASUREMENT RESULT (°C) | | | | |
|---|---|---|---|---|---|---|
| | | RADIATING SHEET SHAPE | | | | |
| No. | MEASUREMENT LOCATION NAME | NO SHEET | SHEET COVERING ENTIRE SURFACE | 5 pcs | 6 pcs | 9 pcs |
| 1 | ATMOSPHERE | 28.4 | 28.1 | 28.4 | 28.5 | 28.7 |
| 2 | CONTROLLER | 92.5 | 70.6 | 75.1 | 73.7 | 74.1 |
| 3 | SDRAM | 78.1 | 64.1 | 72.8 | 72.8 | 72.5 |
| 4 | NAND (LOWER LEFT) | 79.6 | 63.1 | 75.1 | 74.1 | 69.4 |
| 5 | NAND (UPPER RIGHT) | 75.6 | 63.2 | 72.0 | 72.2 | 68.0 |
| 6 | NAND (CENTER) | - | - | 71.2 | 71.0 | 70.2 |
| 7 | CABINET (CONTROLLER SIDE) | 59.3 | 62.0 | 61.5 | 61.4 | 62.0 |
| - | TEMPERATURE SENSOR IC | 79.0 | 64.0 | 72.0 | 72.0 | 71.0 |
| TRANSFER RATE | | 189 MB/s | 192 MB/s | 192 MB/s | 192 MB/s | 192 MB/s |

FIG.22

| MEASUREMENT LOCATION | TEMPERATURE DIFFERENCE FROM CABINET (°C) | | | | |
|---|---|---|---|---|---|
| | RADIATING SHEET SHAPE | | | | |
| | NO SHEET | SHEET COVERING ENTIRE SURFACE | 5 pcs | 6 pcs | 9 pcs |
| CONTROLLER | 33.2 | 8.6 | 13.6 | 12.3 | 12.1 |
| SDRAM | 18.8 | 2.1 | 11.3 | 11.4 | 10.5 |
| NAND (LOWER LEFT) | 20.3 | 1.1 | 13.6 | 12.7 | 7.4 |
| NAND (UPPER RIGHT) | 16.3 | 1.2 | 10.5 | 10.8 | 6.0 |
| NAND (CENTER) | - | - | 9.7 | 9.6 | 8.2 |
| (MAX) | 33.2 | 8.6 | 13.6 | 12.7 | 12.1 |
| ASSUMED TEMPERATURE OF 70°C | 103.2 | 78.6 | 83.6 | 82.7 | 82.1 |

SEMICONDUCTOR STORAGE DEVICE AND METHOD OF MANUFACTURING THE SAME

CROSS-REFERENCE TO RELATED APPLICATIONS

This application is based upon and claims the benefit of priority from the prior Japanese Patent Application No. 2009-172942, filed on Jul. 24, 2009; Japanese Patent Application No. 2009-293492, filed on Dec. 24, 2009; and Japanese Patent Application No. 2010-121629, filed on May 27, 2010; the entire contents of all of which are incorporated herein by reference. And this application is a continuation-in-part of US patent application Ser. No. 12/839,785, with a filing data of Jul. 20, 2010. Priority of the above-mentioned application is claimed and the above-mentioned application is hereby incorporated by reference in its entirely.

FIELD

Embodiments described herein relate generally to a semiconductor storage device and a method of manufacturing the same.

BACKGROUND

As an auxiliary storage device mounted on a computer, an auxiliary storage device including a hard disk drive (HDD) (hereinafter, "HDD device") is used (see Japanese Patent Application Laid-Open NO. 2004-30837).

In recent years, an auxiliary storage device including, as a recording medium, a nonvolatile semiconductor memory such as a NAND flash memory (so-called solid state disk, hereinafter, "SSD device") is mounted on a computer instead of the HDD device. In the SSD device, a plurality of NAND flash memories (hereinafter, "NANDs") and a controller integrated circuit (IC) that controls the NANDs are mounted on a printed circuit board via electrodes (bumps). The SSD device is mounted on the computer after being housed in a housing generally having an external dimension and a shape same as those of the HDD device specified by a standard (e.g., a housing having a size and a shape same as those of a 2.5-inch HDD device). There are several kinds of standards concerning the housing of the HDD device according to the sizes of magnetic disks. In general, a housing such as that for the 2.5-inch HDD device is a box made of metal.

When the SSD device actually operates (when data is actually read and written), a controller generates heat because switching operation is repeatedly performed at high speed. A part of the heat generated from the controller is transmitted to the printed circuit board via the bump set in contact with the controller and further transmitted to the NANDs via a wiring pattern on the printed circuit board the bumps set in contact with the NANDs. In an operation principle, under a high-temperature environment, the NANDs tend to unsteady operate because leak current increases. Therefore, operation guarantee temperature for the NANDs is set low compared with other kinds of ICs. For example, whereas the operation guarantee temperature of the NANDs is about 85° C., the operation guarantee temperature of the other kinds of ICs is about 100° C.

Therefore, in the SSD device, it is necessary to cool the controller to suppress the transmission of the heat from the controller to the NANDs. In the case of the HDD device including a magnetic disk as a recording medium, because the controller and the magnetic disk are arranged separately from each other, the heat generated from the controller does not affect a mechanical section and the like of the magnetic disk. Therefore, it can be said that this problem is peculiar to the SSD device.

As a structure for cooling the controller in the SSD device, it is conceivable to interpose a heat radiation sheet between the controller and a bottom housing. Even if the heat radiation sheet is interposed between the controller and the bottom housing, the entire heat generated from the controller is not always transmitted to the bottom housing. However, a part of the heat is transmitted to the bottom housing via the heat radiation sheet. Consequently, a heat quantity transmitted to the NANDs is reduced to maintain the temperature of the NAND not to exceed the operation guarantee temperature.

According to the improvement of the performance of the SSD device and the computer mounted with the SSD, a heat value during actual operation of the controller tends to increase. For example, a data transfer rate of the SSD in the past is 100 MByte/sec for readout and 40 MByte/sec for writing. Currently, the data transfer rate is improved to 240 MByte/sec for readout and 200 MByte/sec for writing. Therefore, even if the heat radiation sheet is arranged between the controller and the bottom housing, it is difficult to sufficiently radiate the heat generated from the controller. However, an SSD device that takes measures against this problem is not realized.

BRIEF DESCRIPTION OF THE DRAWINGS

FIG. 22 is a diagram illustrating temperature differences between each device mounted on the printed circuit board and the housing and maximum temperatures of devices when the housing temperature is assumed to be 70° C.

DETAILED DESCRIPTION

In general, according to one embodiment, a semiconductor storage device includes: a printed circuit board mounted on with, one surface, respectively via a plurality of bumps, a plurality of first nonvolatile semiconductor memories and a controller that controls reading of data from and writing of data in the first nonvolatile semiconductor memories; a housing that is formed of a conductive material and houses the printed circuit board; and a first heat radiation member that is interposed between a surface of the housing opposed to one surface of the printed circuit board and the controller and first nonvolatile semiconductor memories and thermally connects the controller and first nonvolatile semiconductor memories and the housing. The coupling capacitance in a state in which the first radiation member is arranged between a first capacitor formed by the surface of the housing opposed to one surface of the printed circuit board and the printed circuit board is smaller than coupling capacitance in a state in which an integrally formed object having a relative dielectric constant of 5.8 is arranged between the first capacitor to cover a first radiating region containing the controller and the first nonvolatile semiconductor memories.

Exemplary embodiments of semiconductor storage device and method of manufacturing the same will be explained below in detail with reference to the accompanying drawings. The present invention is not limited to the following embodiments.

(First Embodiment)

Figure 1A:
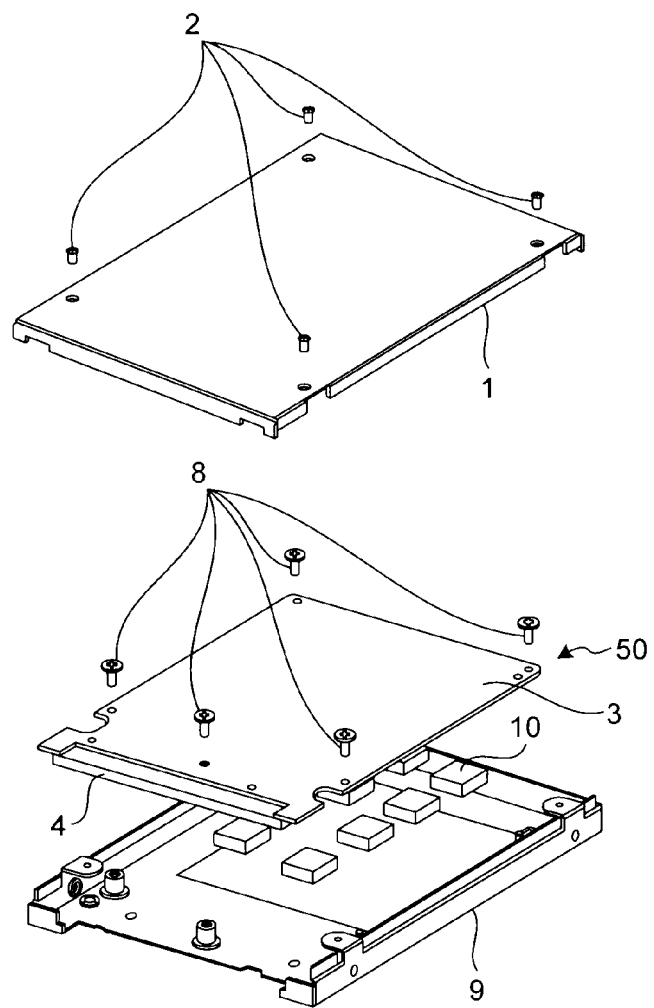
FIG. 1A is a diagram of the configuration of an SSD device and the configuration of a lower surface of a printed circuit board according to a first embodiment.
Figure 1B:
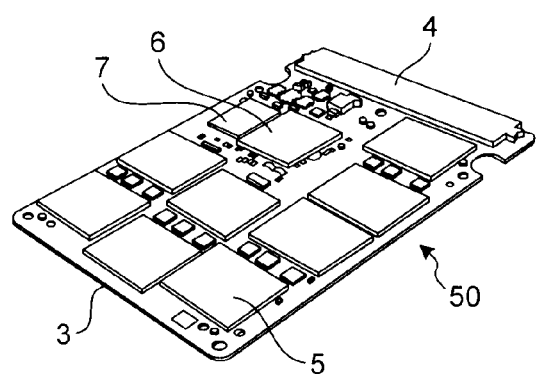
FIG. 1B is a diagram of the configuration on the lower surface side of the printed circuit board of the SSD device according to the first embodiment.
Figure 2:
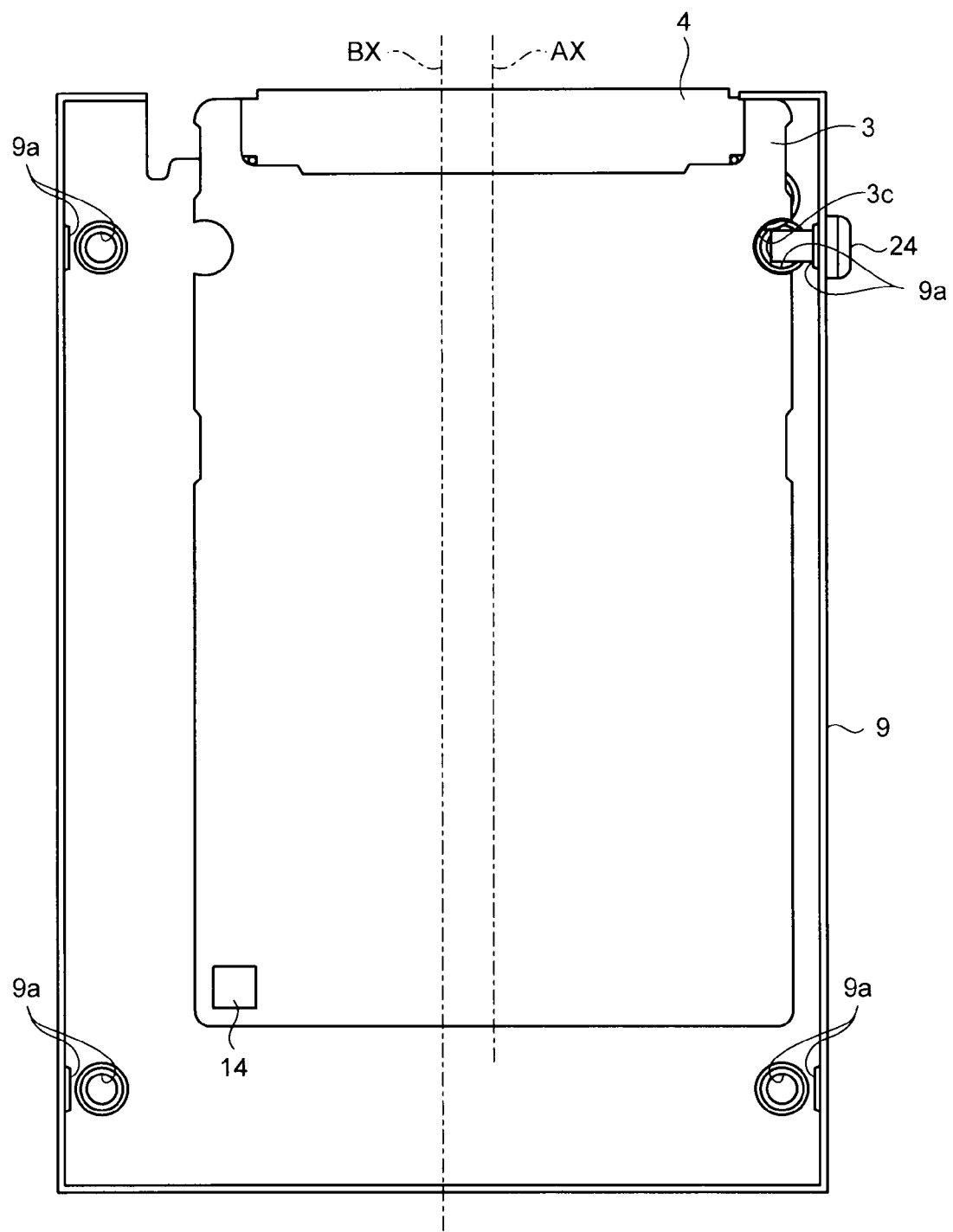
FIG. 2 is a plan view of the internal structure of the SSD device according to the first embodiment.

FIG. 1A is a disassembled perspective view of the configuration of an SSD device according to a first embodiment. FIG. 1B is a perspective view of the configuration on a lower surface side of a printed circuit board 3. FIG. 2 is a plan view of the internal structure of the SSD device according to the first embodiment. The SSD device according to this embodiment includes the printed circuit board 3 mounted with, on the lower surface side, eight NANDs 5 as first nonvolatile semiconductor memories and a controller 6. The printed circuit board 3 is housed in a housing formed by a top cover 1 and a bottom housing 9. The top cover 1 and the bottom housing 9 are formed of a metal material such as aluminum or iron.

The top cover 1 and the bottom housing 9 are coupled by cover fixing screws 2 to form a housing having a substantial hexahedron shape opened on one side. The printed circuit board 3 is screwed to the bottom housing 9 by fixing screws 8 in a state in which heat radiation sheets 10 (first heat radiation members) are interposed between the controller 6 and NANDs 5 and the bottom housing 9. A connector 4 is arranged at one end of the printed circuit board 3. The connector 4 is an interface that connects a host apparatus such as a computer and the SSD device. A shape and the like of the connector 4 are decided to conform to, for example, a serial advanced technology attachment (SATA) standard as a connection interface standard. The connector 4 is exposed to the outside of the housing in an opened surface of the housing. The SSD device is connected to the computer as the host apparatus that is an apparatus on which the SSD is mounted. In the following explanation, the printed circuit board 3 mounted with the connector 4, the NANDs 5, and the controller 6 is also referred to as semiconductor memory device 50. The SSD device according to this embodiment is a box-type semiconductor storage device in which the semiconductor memory device 50 is housed in a housing of a 2.5-inch type same as the housing of the HDD device.

Each of the heat radiation sheets 10 is formed to have flexibility with a material containing silicone resin and ceramics filler. Each of the heat radiation sheets 10 is pressed by the controller 6, the NAND 5, and the bottom housing 9 mounted on the printed circuit board 3 and closely attached to both of the printed circuit board 3 and the controller 6, the NAND 5, and the bottom housing 9. Consequently, the controller 6, the NAND 5, and the bottom housing 9 are thermally connected. An SDRAM 7 has high heat resistance. No deficiency occurs even if heat from the controller 6 is transited to the SDRAM 7. Therefore, the heat radiation sheet 10 is not arranged between the SDRAM 7 and the bottom housing 9. The heat radiation sheet 10 has a size for realizing a heat radiation effect sufficient for preventing the temperature of the controller 6 and the NAND 5 from rising to be equal to or higher than a design value (e.g., 85° C. as the operation guarantee temperature). As explained later, the first heat radiation member is not limited to a heat radiation sheet molded in a sheet shape and can be a gel member. However, in an example explained below, the heat radiation sheet is used.

The printed circuit board 3 has a multilayer structure formed by superimposing synthetic resin. In this embodiment, the printed circuit board 3 has an eight-layer structure. On the printed circuit board 3, a circuit pattern 3a (not shown in FIG. 1A) is formed in various shapes on the surfaces or the insides of the layers formed of the synthetic resin. The NANDs 5, the controller 6, and the connector 4 mounted on the printed circuit board 3 are electrically connected via the circuit pattern 3a formed on the printed circuit board 3.

In the SSD device according to this embodiment as the box-type semiconductor storage device, in the semiconductor memory device 50, as shown in FIG. 2, a center axis AX thereof is arranged to be shifted with respect to a center axis BX of the bottom housing 9. This is because the position of the connector 4 with respect to the housing is decided by a standard such as serial ATA revision 2.6. Because the center axis AX and the center axis BX are shifted from each other, one side of the printed circuit board 3 is set close to a wall surface of the housing.

Figure 3A:
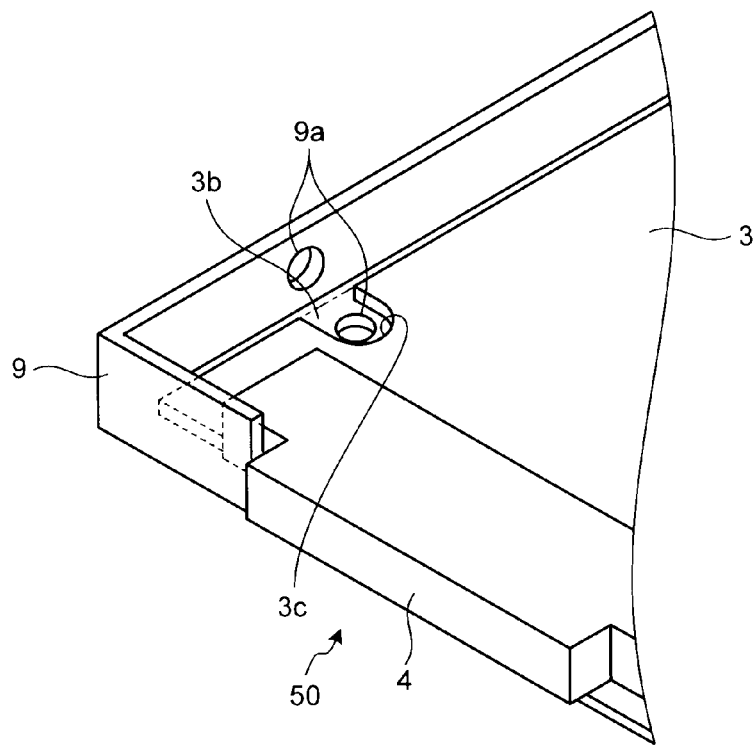
FIG. 3A is a partially enlarged perspective view of an interference section of the printed circuit board in a state in which a screw is not inserted into a screw hole.
Figure 3B:
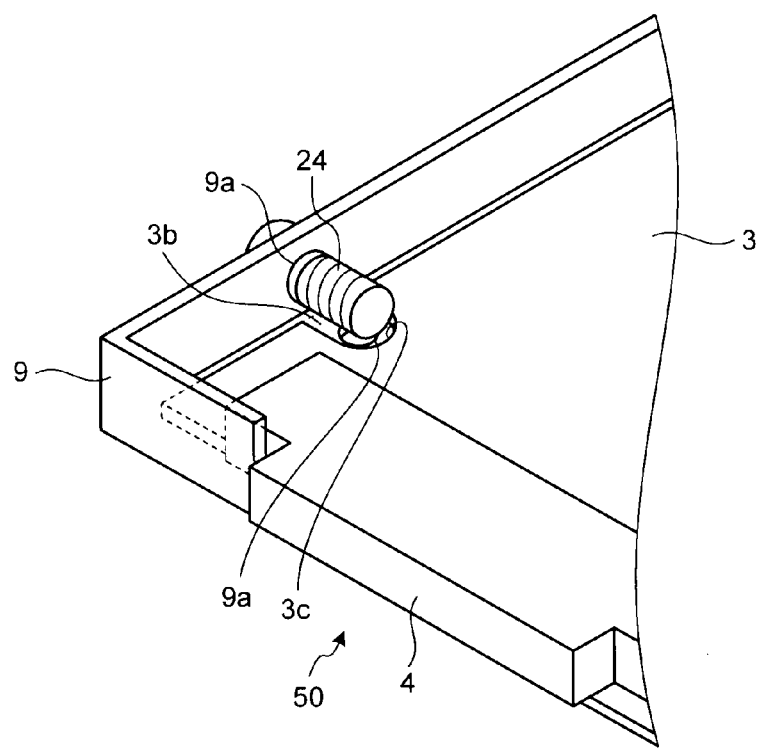
FIG. 3B is a partially enlarged perspective view of the interference section of the printed circuit board in a state in which the screw is inserted into the screw hole from a side.

FIG. 3A is a partially enlarged perspective view of an interference section 3b of the printed circuit board 3 in a state in which a screw 24 is not inserted into a screw hole 9a. FIG. 3B is a partially enlarged perspective view of the interference section 3b of the printed circuit board 3 in a state in which the screw 24 is inserted into the hole 9a from a side. When the SSD device is fixed to the host apparatus such as the computer, the fixing screw 24 (housing fixing means) is inserted from the side or the bottom of the bottom housing 9. To insert the screw 24, screw holes 9a are respectively formed on the side and the bottom.

The screw 24 inserted into the screw hole 9a on a direction side to which the center axis AX of the semiconductor memory device 50 is shifted interferes with a part (the interference section 3b) of the printed circuit board 3 set close to the wall surface of the housing.

In the printed circuit board 3 used in the SSD device according to this embodiment, the interference section 3b is cut out to form a cutout 3c. Therefore, the screw 24 and the printed circuit board 3 can be actually prevented from interfering with each other. Therefore, the printed circuit board 3 can be prevented from being broken or bent by interference with the screw 24. Specifically, the cutout 3c is formed near the connector 4 and on one side of the printed circuit board 3 that is close to the wall surface of the housing when the semiconductor memory device 50 is housed in the housing.

The printed circuit board 3 can also be used in a module-type semiconductor storage device in which the semiconductor memory device 50 is used without being housed in a housing or the like to conform to the MO-297 standard set up by the Joint Electron Device Engineering Council (JEDEC).

In the semiconductor memory device 50 for the module-type semiconductor device and the semiconductor memory device 50 for the box-type semiconductor storage device, a part of a shape of the printed circuit board 3 included in the semiconductor memory device 50 is different. Specifically, a part of the printed circuit board 3 of the semiconductor memory device 50 for the box-type semiconductor storage device is cut out to form the cutout 3c.

An external dimension and the like of the module-type semiconductor storage device are specified by, for example, the MO-297 standard of the JEDEC. In the module-type semiconductor storage device, because the semiconductor memory device 50 is used without being housed in the housing, an external dimension and the like of the semiconductor memory device 50 itself are specified. Consequently, an external dimension and the like of the printed circuit board 3 included in the semiconductor memory device 50 are also specified.

Figure 4:
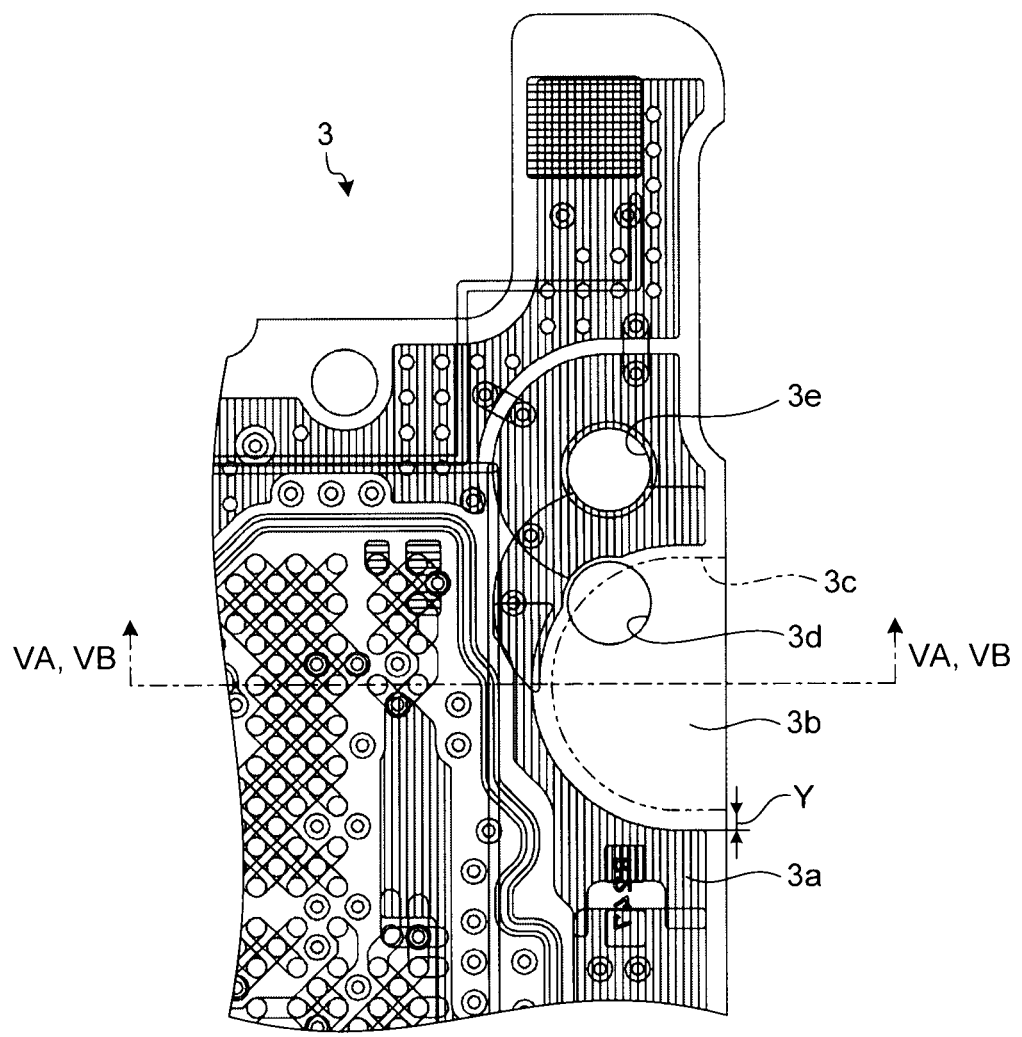
FIG. 4 is a partially enlarged plan view of the periphery of the interference section in a circuit pattern.

FIG. 4 is a partial enlarged plan view of the periphery of the interference section 3b. The MO-297 standard of the JEDEC specifies that, as shown in FIG. 4, a hole 3d is provided in a section equivalent to the cutout 3c. Therefore, it is difficult to form the cutout 3c in the printed circuit board 3 in the module-type semiconductor storage device. However, when the SSD device is used as the module-type semiconductor storage device, because the semiconductor memory device 50 is not housed in the housing, interference with a screw does not pose a problem even when the cutout 3c is not formed. The hole 3d provided in the section equivalent to the cutout 3c is used, for example, when the SSD device as the module-type semiconductor storage device is fixed to the host apparatus such as the computer by using a screw. A hole 3e formed near the hole 3d is used when the semiconductor memory device 50 as the box-type semiconductor storage device is fixed to the housing (the bottom housing 9).

As explained above, the printed circuit board 3 is also used when the SSD device is configured as the module-type semiconductor storage device. Therefore, a discriminating section 14 is formed as shown in FIG. 2. The discriminating section 14 is formed to discriminate whether the printed circuit board 13 is used in the module-type semiconductor storage device or used in the box-type semiconductor storage device. Information necessary for manufacturing such as lot numbers of components mounted on the printed circuit board 3 can also be managed by using the discriminating section 14. The discriminating section 14 is, for example, a two-dimensional code printed to be readable from the surface of the printed circuit board 3. The discriminating section 14 is printed by a marker or the like before the NANDs 5 and the like are mounted. The discriminating section 14 is formed to avoid positions where the NANDs 5 and the like are mounted. Therefore, the discriminating section 14 is readable even after the NANDs 5 and the like are mounted. The discriminating section 14 only has to be able to discriminate whether the semiconductor memory device 50 is used as the module-type semiconductor memory or used as the box-type semiconductor storage device. The discriminating section 14 is not limited to the two-dimensional code. For example, the discriminating section 14 can be a barcode or can be an IC chip. The discriminating section 14 can be a difference of a shape such as unevenness formed on the printed circuit board 3. The discriminating section 14 can be formed in a place other than a position shown in the figure. For example, the discriminating section 14 can be printed on the surface of each of devices such as the NANDs 5.

Figure 5A:
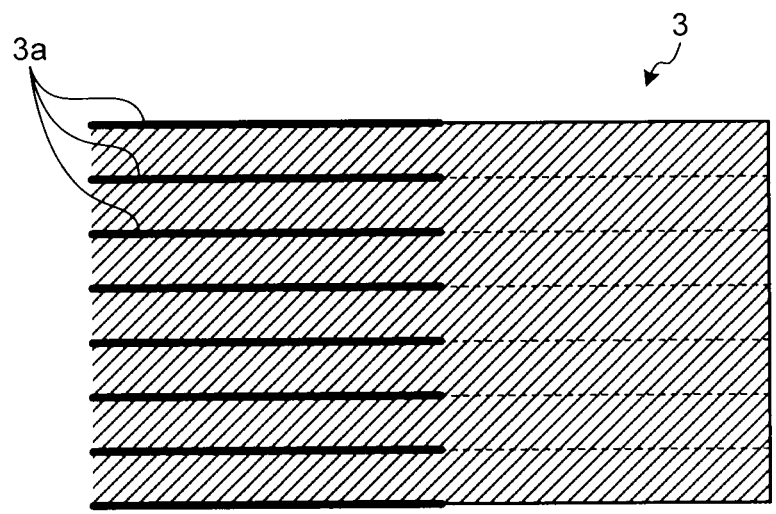
FIG. 5A is an arrow sectional view taken along line VA, VB-VA, VB shown in FIG. 4 of a printed circuit board used in a module-type semiconductor storage device.
Figure 5B:
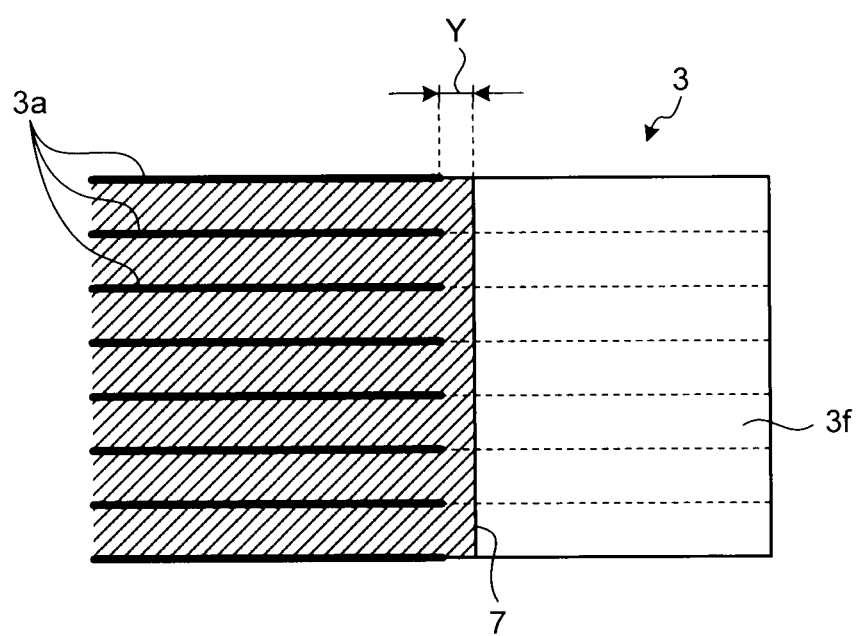
FIG. 5B is an arrow sectional view taken along line VA, VB-VA, VB shown in FIG. 4 of a printed circuit board used in a box-type semiconductor storage device.

The configuration of the circuit pattern 3a formed on the printed circuit board 3 is explained below. FIG. 5A is an arrow sectional view taken along line VA, VB-VA, VB shown in FIG. 4 of the printed circuit board 3 used in the module-type semiconductor storage device. FIG. 5B is an arrow sectional view taken along line VA, VB-VA, VB shown in FIG. 4 of the printed circuit board 3 used in the box-type semiconductor storage device. A conductive metal material, for example, copper is used for the circuit pattern 3a. The circuit pattern 3a is formed in substantially the entire region in plan view of the printed circuit board 3. However, as shown in FIG. 4, the circuit pattern 3a is formed to avoid the interference section 3b. A space (a resin region where the circuit pattern 3a is not formed) Y is provided between a cut line in cutting out the interference section 3b (a formation line of the cutout 3c) and the circuit pattern 3a. In this embodiment, Y is set to 0.5 millimeter. In the semiconductor memory device 50, in some case, a screw inserted into the hole 3d provided in the section equivalent to the cutout 3c and the circuit pattern 3a are set in contact with each other and grounded. By suppressing the space Y to a predetermined distance, the head of the screw and the circuit pattern 3a can be set in contact with each other and grounded.

The circuit pattern 3a is formed in other layers different from the layer shown in FIG. 4. Only an example of the circuit pattern 3a is shown in FIG. 4. In all the layers different from the layer shown in FIG. 4, the circuit pattern 3a is formed to avoid the interference section 3b and the space Y is provided. The devices such as the NANDs 5 are not arranged in the interference section 3b.

As shown in FIG. 5B, because the predetermined space Y is provided between the cut line in cutting out the interference section 3b and the circuit pattern 3a, the circuit pattern 3a is not exposed at an edge 3f when the interference section 3b is cut out.

Figure 6:
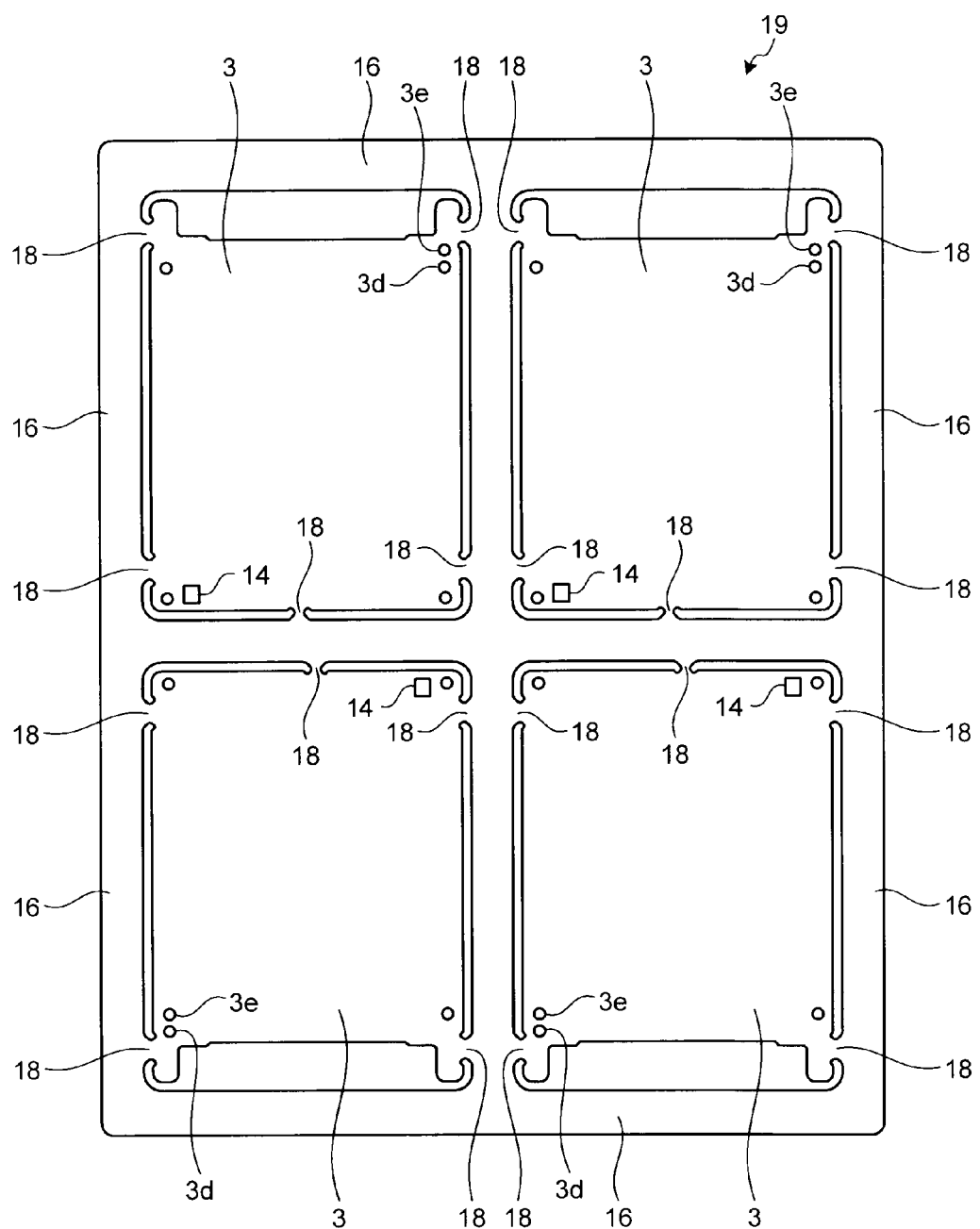
FIG. 6 is a plan view of a sheet-like substrate.

FIG. 6 is a plan view of a sheet-like substrate 19. The sheet-like substrate 19 includes printed circuit boards 3 and a peripheral section 16. The peripheral section 16 is provided to surround the printed circuit boards 3 and coupled to the printed circuit boards 3 via coupling sections 18. The peripheral section 16 surrounds the printed circuit boards 3 having unevenness in an external shape thereof and forms an external shape of the sheet-like substrate 19 in a substantially square shape. Consequently, handleability of the printed circuit boards 3 in mounting the NANDs 5 is improved.

The NANDs 5 and controllers 6 are mounted on the sections of the printed circuit boards 3 in a state of the sheet-like substrate 19 to which the peripheral section 16 is coupled. The peripheral section 16 can be separated to obtain the semiconductor memory device 50 from the sheet-like substrate 19 by cutting off the coupling sections 18 using a drill of a divider. Cutouts 3c of the printed circuit boards 3 are formed when the coupling sections 18 are cut off. In this embodiment, four semiconductor memory devices 50 can be obtained from one sheet-like substrate 19 by separating the peripheral section 16 from the sheet-like substrate 19 mounted with the NANDs 5 and the controllers 6. The number of semiconductor memory devices 50 that can be obtained from the one sheet-like substrate 19 is not limited to four. A larger number of semiconductor memory devices 50 can be obtained from the one sheet-like substrate 19 by using a larger sheet-like substrate 19. One semiconductor memory device 50 can be obtained from the one sheet-like substrate 19.

Figure 7:
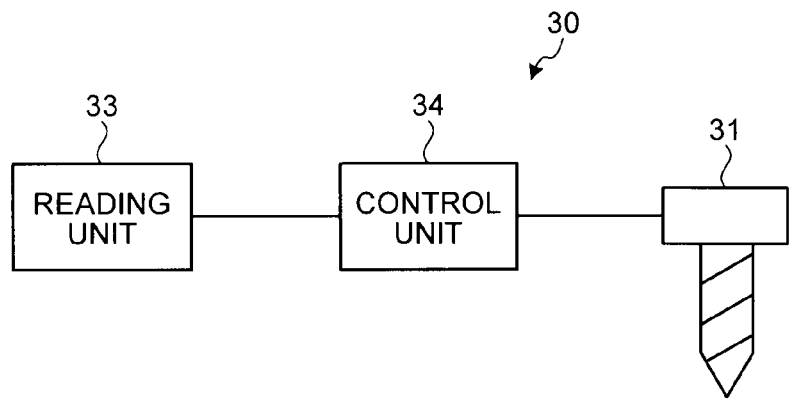
FIG. 7 is a block diagram of the schematic configuration of a PC board processing apparatus.

FIG. 7 is a block diagram of the schematic configuration of a PC board processing apparatus (manufacturing apparatus). A PC board processing apparatus 30 includes a drill 31, a reading unit 33, and a control unit 34. The drill 31 functions as a cutting unit that cuts off the coupling sections 18 of the sheet-like substrate 19 and cuts out the interference section 3b. The reading unit 33 reads the discriminating section 14 and discriminates whether the printed circuit board 13 is used in the module-type semiconductor storage device or used in the box-type semiconductor storage device. The control unit 34 automatically reads processing data and controls the drill 31 based on a discrimination result of the reading unit 33 to cut off the coupling sections 18 and cut out the interference section 3b.

Figure 8:
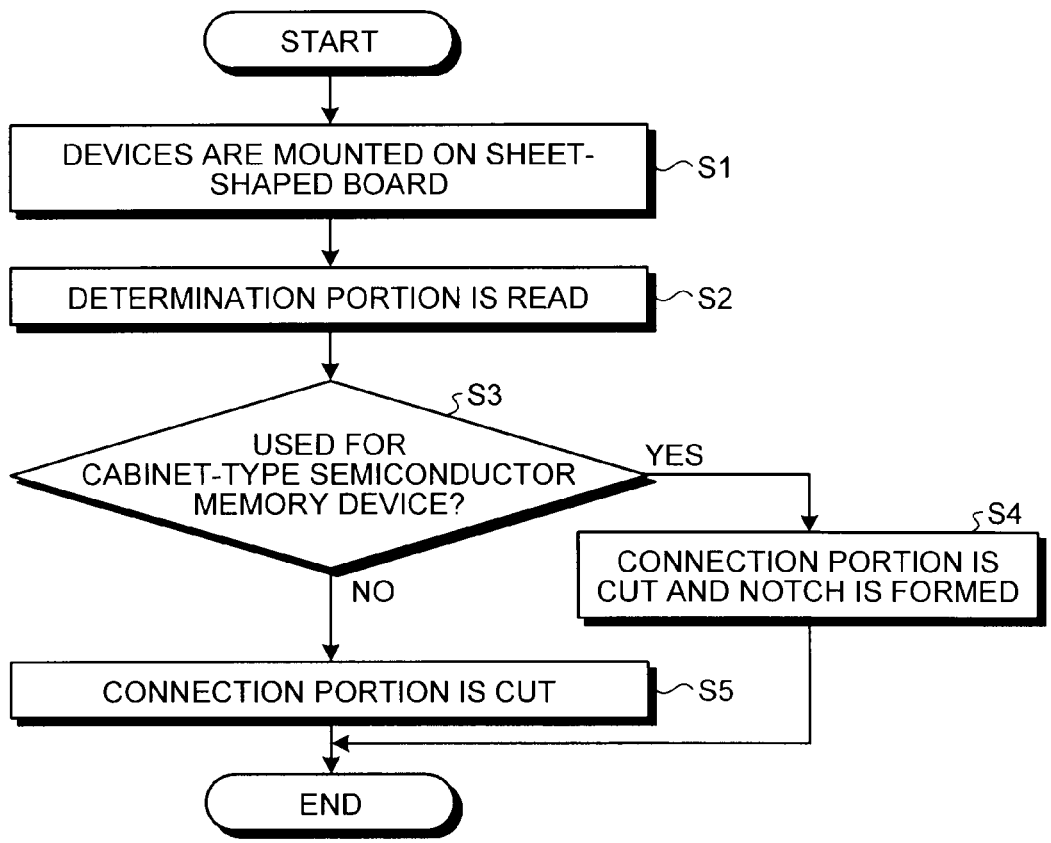
FIG. 8 is a flowchart for explaining a PC board processing process.

FIG. 8 is a flowchart for explaining a PC board processing process. First, devices such as the NANDs 5, the controllers 6, and connectors 4 are mounted on the sheet-like substrate 19 (step S1). Subsequently, discriminating sections 14 are read and processing data is automatically read based on a discrimination result (step S2). When it is discriminated that the printed circuit boards 3 are used in the box-type semiconductor storage device ("Yes" at step S3), the coupling sections 18 are cut off and interference sections 3b are cutout by the drill 31 to form the cutouts 3c (step S4). Consequently, the four semiconductor memory devices 50 in which the cutouts 3c are formed are obtained from the one sheet-like substrate 19.

When it is discriminated at step S3 that the printed circuit boards 3 are not used in the box-type semiconductor storage device but is used in the module-type semiconductor storage device ("No" at step S3), the cutouts 3c are not formed and the coupling sections 18 are cut off (step S5).

Consequently, the four semiconductor memory devices 50 in which the cutouts 3c are not formed are obtained from the one sheet-like substrate 19. The step of forming the cutouts 3c and the step of cutting off the coupling sections 18 can be separately performed and whichever of the steps can be performed earlier.

As explained above, the circuit pattern 3a is formed to avoid the interference section 3b of the printed circuit board 3 and the devices such as the NANDs 5 are arranged to avoid the interference section 3b. Therefore, the arrangement of the circuit pattern 3a and the devices of the printed circuit board 3 can be used in common irrespectively of whether the semiconductor memory device 50 is used in the module-type semiconductor storage device or used in the box-type semiconductor storage device. The arrangement of the circuit pattern 3a and the devices of the printed circuit board 3 can be used in common irrespectively of presence or absence of the cutout 3c. This makes it possible to suppress design cost for the arrangement of the circuit pattern 3a and the devices. Because mounting evaluation and performance evaluation can be used in common, it is also possible to suppress evaluation cost. Because the devices to be mounted can be used in common, it is also possible to suppress selection cost for the devices. When the semiconductor memory device 50 is used in the module-type semiconductor storage device, because the cutout 3c is not formed, it is possible to satisfy the formation of a hole requested by the MO-297 standard. On the other hand, when the semiconductor memory device 50 is used in the box-type semiconductor storage device, it is possible to prevent interference between the screw and the printed circuit board 3 by forming the cutout 3c.

Because the circuit pattern 3a is formed to avoid the interference section 3b, when the cutout 3c is formed, the drill 31 does not have to be caused to cut off the circuit pattern 3a. Consequently, when the cutout 3c is formed, it is possible to cause the drill 31 to cut off only resin. Therefore, the life of the drill 31 can be extended. As shown in FIG. 5B, the circuit pattern 3a is not exposed in the edge when the interference section 3b is cut out. Therefore, a metal burr less easily occurs at the edge. This makes it possible to prevent the metal burr from short-circuiting the circuit patterns 3a formed among the layers of the printed circuit board 3. It is also possible to prevent the metal burr from separating from the printed circuit board 3 to cause short-circuit and the like in other places.

In the above explanation, when the peripheral section is separated from the sheet-like substrate 19, the interference section 3b is cut out to form the cutout 3c. However, the formation of the cutout 3c is not limited to this. For example, it is also possible to store the semiconductor memory device 50 as the module-type semiconductor storage device without forming the cutout 3c when the peripheral section is separated and, when the semiconductor memory device 50 is used in the box-type semiconductor storage device a posteriori, cut out the interference section 3b to form the cutout 3c.

Figure 9:
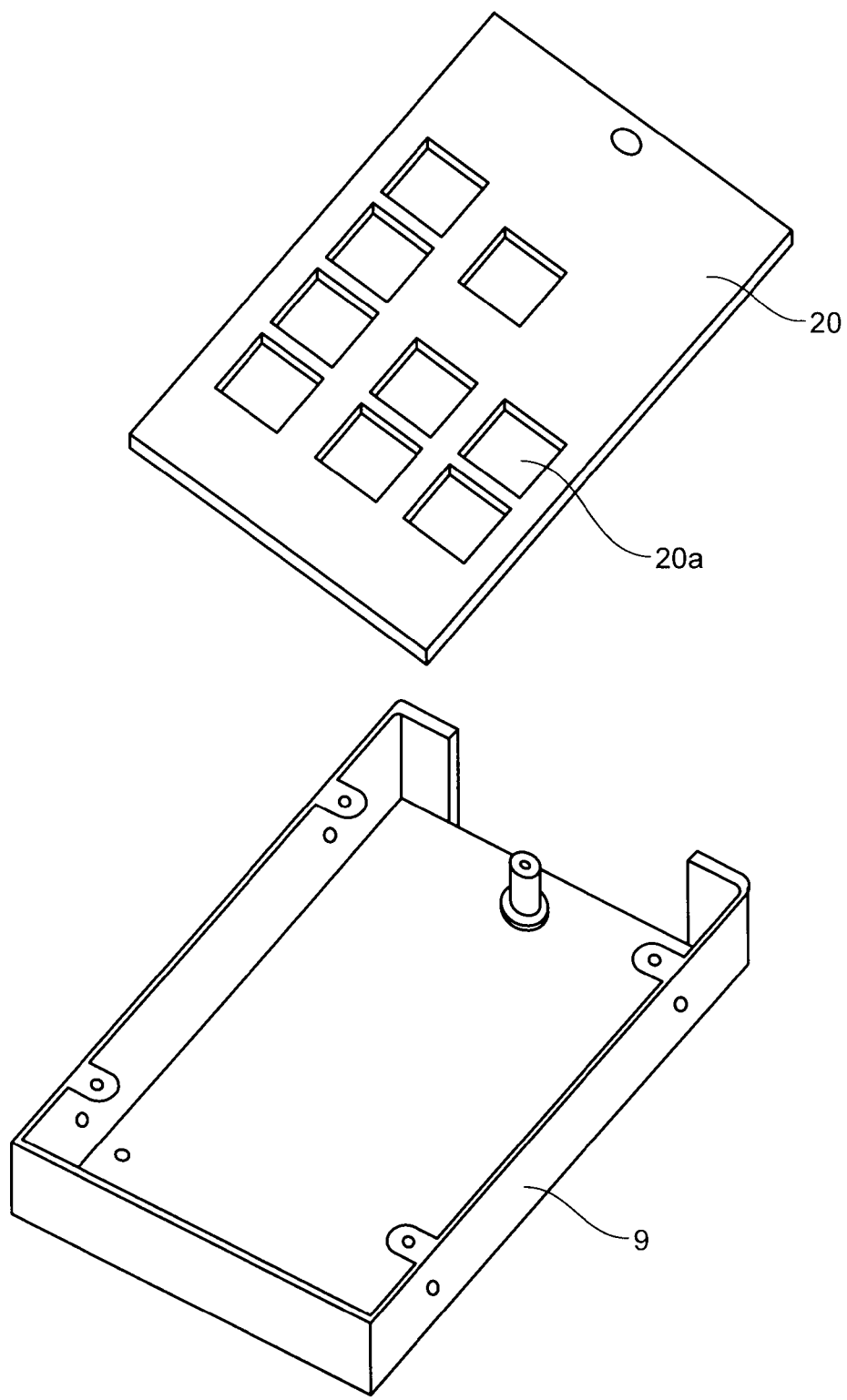
FIG. 9 is a diagram of the configuration of a template including through-holes in places corresponding to a controller and NANDs.

A procedure for assembling the SSD device including the semiconductor memory device 50 is explained below. First, as shown in FIG. 9, a template 20 including through-holes 20a in places corresponding to the controller 6 and the NANDs 5 is arranged in a predetermined position in the bottom housing 9. The heat radiation sheets 10 are stuck to the inner surface of the bottom housing 9 via the through holes 20a. After the heat radiation sheets 10 are stuck, the template 20 is removed from the bottom housing 9. The semiconductor memory device 50 is mounted on the template 20 and screwed to the template 20 by the fixing screws 8. (In the figure, a procedure for sticking heat radiation sheets using a template is shown. However, the heat radiation sheets can be directly stuck to a package of a corresponding IC without using the template. However, in that case, it is necessary to contrive means for preventing mounted components other than the IC from being damaged during sticking work.) The heat radiation sheets 10 are respectively interposed between the controller 6 and NANDs 5 and the bottom housing 9 through such a procedure, whereby setting workability for the heat radiation sheets 10 is improved. Because the printed circuit board 3 is assembled to cover the heat radiation sheets 10, the heat radiation sheets 10 do not fall from top surfaces (surfaces opposed to the bottom housing 9) of the controller 6 and the NANDs 5 during assembly work. Thereafter, the top cover 1 is placed over the bottom housing 9 and the cover fixing screws 2 are tightened, whereby the assembly of the SSD device is completed.

Figure 10:
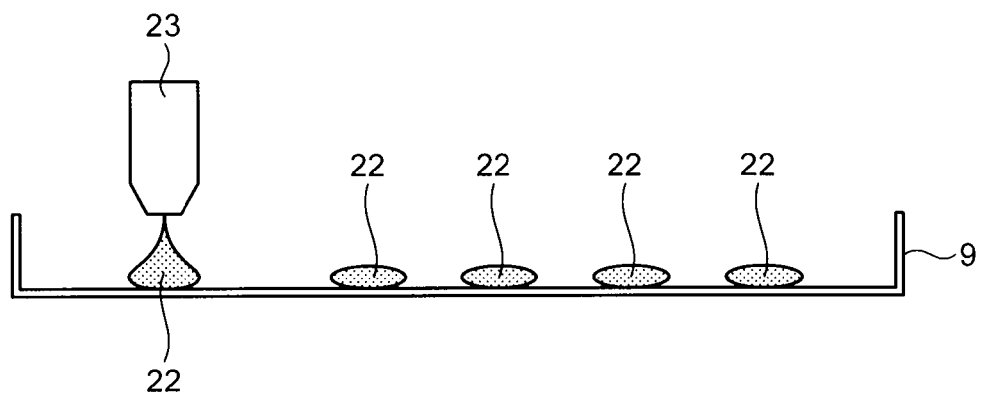
FIG. 10 is a diagram of a state in which a gel member of a room temperature curing type before curing is injected into a predetermined position in a bottom housing.
Figure 11:
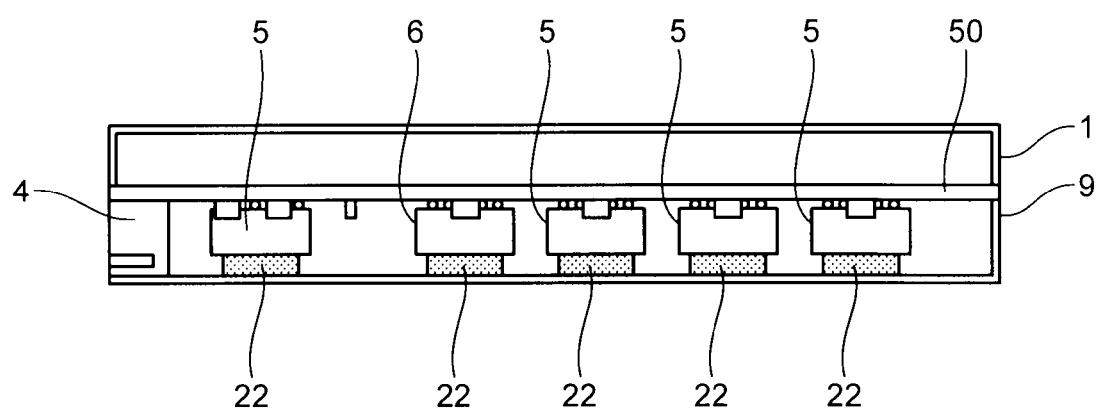
FIG. 11 is diagram of a state after completion of assembly of an SSD apparatus including a semiconductor memory device.

An assembling procedure for an SSD apparatus substituting a gel member for the heat radiation sheet as the first heat radiation member is explained below. First, as shown in FIG. 10, a gel member 22 of a room temperature curing type in a state of a fluid is injected into a predetermined position in the bottom housing 9. When the gel member 22 is injected, an application amount of the gel member 22 is controlled by a dispenser 23 or the like. Subsequently, the gel member 22 is left intact in a room temperature state and cured (set). Thereafter, the semiconductor device 50 is fixed to the bottom housing 9. The NAND 5 and the controller 6 are brought into contact with the gel member 22. Thereafter, the top cover 1 and the bottom housing 9 are laid one on top of the other and fastened by fixing screws. Consequently, as shown in FIG. 11, the assembly of the SSD apparatus is completed as shown in FIG. 11.

In this case, at a point when the semiconductor memory device 50 is housed in the bottom housing 9, a leak of the gel member 22 already less easily occurs. Extrusion and a leak of the gel member 22 do not easily occur. Therefore, it is easy to automate an injection process for the gel member 22 using an industrial robot or the like. It is possible to realize a reduction in manufacturing cost. If the gel member 22 has viscosity and surface tension enough for not spreading exceeding a predetermined area (e.g., an area opposed to the NAND 5 and the controller 6) from application to curing of the gel member 22, it is also possible to house the semiconductor memory device 50 in the bottom housing 9 before the curing of the gel member 22. In other words, even if the gel member 22 is compressed by the NAND 5, the controller 6, and the bottom housing 9 when the semiconductor memory device 50 is housed in the bottom housing 9, an application amount of the gel member 22 only has to be controlled to an amount enough for maintaining a shape of the gel member 22 with the surface tension and the viscosity. When a certain length of time elapses after the semiconductor memory device 50 is housed in the bottom housing 9, the gel member 22 is cured. Therefore, even when the SSD apparatus is used as a product, it is possible to suppress a leak of the gel member 22.

In general, the gel member is more inexpensive than the heat radiation sheet. Therefore, if the gel member is used, it is possible to realize a further reduction in manufacturing cost for the SSD apparatus.

A reason for individualizing the heat radiation sheets 10 in this embodiment is explained below.

Figure 12:
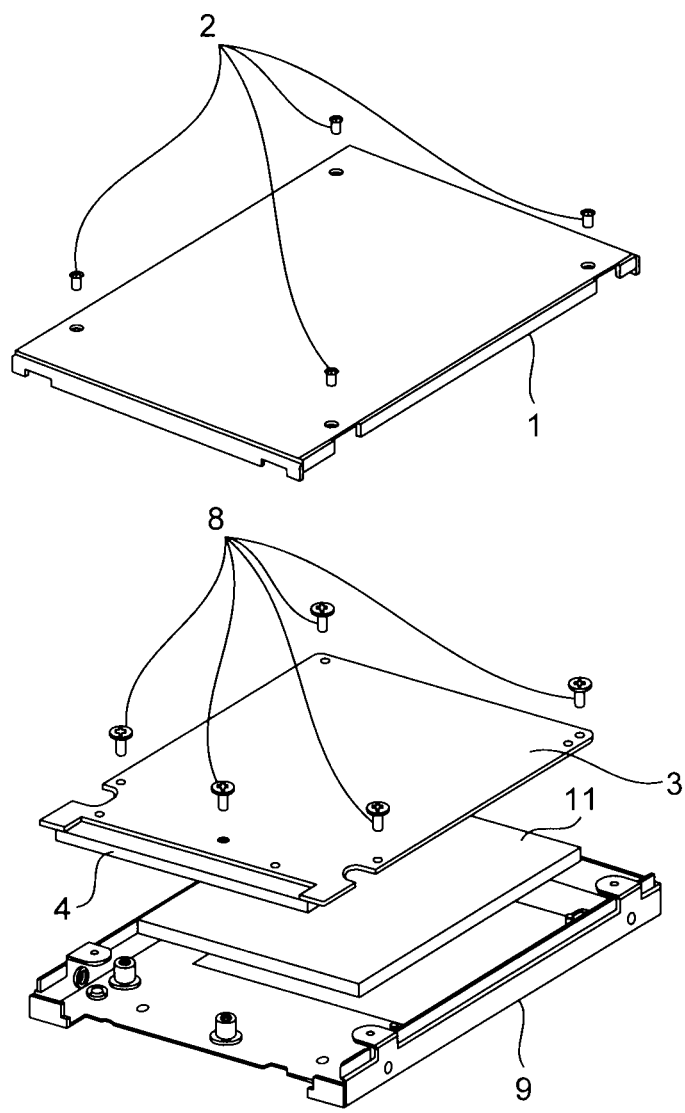
FIG. 12 is a diagram of the configuration of an SSD device using a radiation sheet integrally formed to cover a radiating region containing the controller and NANDs.

As measures against heat of the NANDs, it is conceivable to thermally connect the NANDs and the bottom housing via the heat radiation sheets. As an example of this structure, there is a structure in which a heat radiation sheet 11 having a minimum rectangular shape that covers a radiating region (first radiating region) containing a plurality of the NANDs 5 and the controller 6 is interposed between the controller 6 and NANDs 5 and the bottom housing 9. FIG. 12 is a disassembled perspective view of an SSD device having a configuration for covering the region containing the controller 6 and the NANDs 5 with one integrally formed heat radiation sheet 11. The SSD device is the same as the SSD device shown in FIG. 1A except that the heat radiation sheet 11 has the minimum rectangular shape for covering the controller 6 and the NANDs 5. The configuration of the lower surface of the printed circuit board 3 of the semiconductor memory device 50 is the same as that shown in FIG. 1B. The SSD device shown in FIG. 12 is explained below in comparison with the SSD device according to the first embodiment shown in FIG. 1A.

Figure 13:
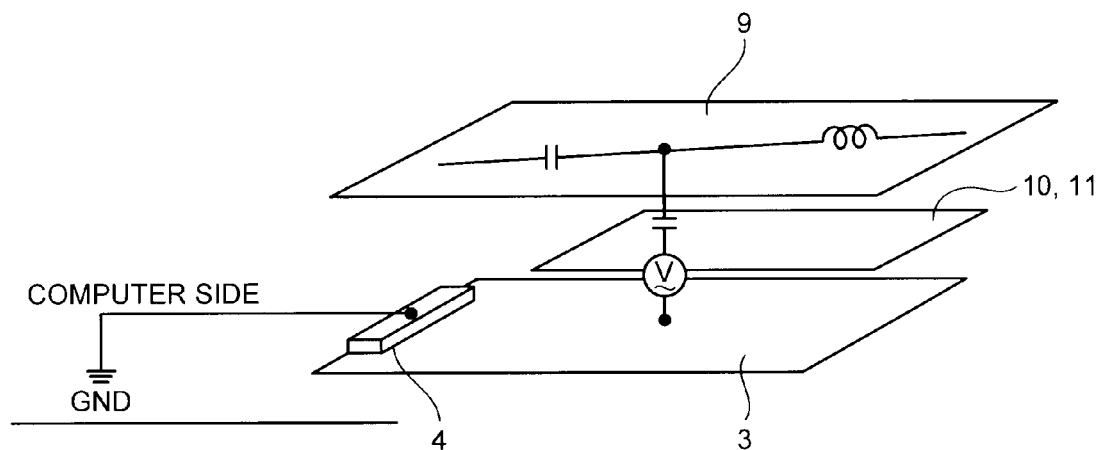
FIG. 13 is a diagram of a model of a parallel flat capacitor formed by a printed circuit board and a bottom housing.

The printed circuit board 3 of the SSD device is arranged substantially parallel to the bottom housing 9. Therefore, it can be regarded that a parallel flat capacitor is formed by the printed circuit board 3 and the bottom housing 9. A model of the parallel flat capacitor formed by the printed circuit board 3 and the bottom housing 9 is shown in FIG. 13. The printed circuit board 3 and the bottom housing 9 are parallel flat plates and coupling capacitance (capacitance) is generated. Because the heat radiation sheets 10 or the heat radiation sheet 11 is arranged between the parallel flat plates, the coupling capacitance fluctuates according to an area of a region where the heat radiation sheets 10 or the heat radiation sheet 11 is present and a relative dielectric constant of the heat radiation sheets 10 or the heat radiation sheet 11.

The printed circuit board 3 receives the supply of electric power from the computer connected via the connector 4 and operates as an SSD. High-frequency noise occurs from the NANDs 5 and the controller 6 because of an internal operation clock and read/write data. The noise propagates to the bottom housing 9 according to capacitive coupling of the printed circuit board 3 and the bottom housing 9.

The bottom housing 9 resonates with respect to an electromagnetic wave having a frequency (1/n) times (n=1, 2, 4, 8, . . . ) as high as a frequency with a dimension in a longitudinal, lateral, or diagonal direction of the bottom housing 9 set as one wavelength and functions as an efficient antenna. For example, if the long side, the short side, and the diagonal of the bottom housing 9 are 0.1 meter, 0.06985 meter, and 0.122 meter, respectively, in the long side direction, electromagnetic waves having frequencies 3 GHz, 1.5 GHz, 0.75 GHz, 0.375 GHz, and the like resonate. In the short side direction, electromagnetic waves having frequencies 4.295 GHz, 2.147 GHz, 1.074 GHz, 0.537 GHz, and the like resonate. In the diagonal direction, electromagnetic waves having frequencies 2.459 GHz, 1.230 GHz, 0.615 GHz, 0.307 GHz, and the like resonate. The electromagnetic waves having these frequencies are radiated into the air via the bottom housing 9 as an antenna.

In the example explained above, resonant frequencies are present over substantially all bands of 300 MHz to 1 GHz included as measurement ranges in electromagnetic interference (EMI) standards of countries and regions specified in the CE, the Voluntary Control Council for Interference by information technology equipment (VCCI), the Federal Communications Commission (FCC), and the like. However, because of a difference in dimensions in the longitudinal, lateral, and diagonal directions of the bottom housing 9, the resonant frequency of 0.537 GHz at ⅛ wavelength in the short side direction, the resonant frequency of 0.615 GHz at ¼ wavelength in the diagonal direction, and the resonant frequency of 0.750 GHz at ¼ wavelength in the long side direction have a small frequency difference of a resonant frequency. When operation speed of the SSD device is increased, noise corresponding to the bands tends to occur and resonate with the bottom housing 9. Therefore, unnecessary radiation caused by the bottom housing 9 functioning as an antenna becomes more conspicuous according to the increase in the operation speed of the SSD device.

As explained above, the arrangement of the heat radiation sheets 10 or the heat radiation sheet 11 to cool the controller 6 and the NANDs 5 is nothing but insertion of an object having a relative dielectric constant (a relative dielectric constant of a material of the heat radiation sheets 10 or the heat radiation sheet 11) between the parallel flat plates of the parallel flat capacitor (between the printed circuit board 3 and the bottom housing 9). Therefore, when the heat radiation sheets 10 or the heat radiation sheet 11 is arranged, the coupling capacitance of the parallel flat capacitor increases compared with coupling capacitance in a state in which the printed circuit board 3 and the bottom housing 9 are simply opposed to each other. The bottom housing 9 easily functions as an antenna. When the heat radiation sheet 11 integrally formed to cover the radiating region containing the controller 6 and the NANDs 5 is set, the coupling capacitance of the capacitor increases more than the coupling capacitance of the capacitor obtained when the individual heat radiation sheets 10 are arranged. Therefore, the heat radiation sheet 11 integrally formed to cover the radiating region containing the controller 6 and the NANDs 5 is disadvantageous in terms of a reduction in unnecessary radiation caused by the bottom housing 9 functioning as the antenna.

A relative dielectric constant of a material of an existing heat radiation sheet is about 5.8. When the heat radiation sheet is integrally formed and arranged to cover the radiating region containing the controller 6 and the NANDs 5, an EMI characteristic of the SSD device can conform to the EMI standard at the very limit. It is likely that the EMI characteristic does not conform to the standard depending on shield performance of a computer as an apparatus on which the SSD device is mounted. If the operation speed of the SSD device is further increased, it is more highly likely that the EMI characteristic does not conform to the EMI standard. When a margin is given to the EMI standard and stricter specifications are required, it is likely that the required specifications cannot be met even by the current operation speed.

In this embodiment, with the above points taken into account, the individual heat radiation sheets 10 are adopted to suppress an increase in the coupling capacitance of the parallel flat capacitor. Because the heat radiation sheets 10 are individualized, a total of areas occupied by the heat radiation sheets 10 is small compared with an area of the heat radiation sheet 11 integrally formed to cover the radiating region containing the controller 6 and the NANDs 5. Therefore, the coupling capacitance of the capacitor decreases, impedance from a noise source to an antenna side increases, a transmission level decreases, and the unnecessary radiation caused by the bottom housing 9 functioning as the antenna is reduced.

A difference between the use of the individual heat radiation sheets 10 and the use of the heat radiation sheet 11 integrally formed to cover the radiating region containing the controller 6 and the NANDs 5 is explained more in detail below with reference to specific numerical values as examples. However, the present invention is not limited to the numerical values referred to as the examples.

Each of the individual heat radiation sheets 10 has longitudinal and lateral length of 0.01 meter and thickness of 0.003 meter. The printed circuit board 3 has longitudinal length of 0.063 meter and lateral length of 0.0865 meter. The bottom housing 9 has a long side of 0.1 meter, a short side of 0.06985 meter, and a diagonal of 0.122 meter.

A space between the printed circuit board 3 and the bottom housing 9 is 0.0044 meter. Mounting height of the controller 6 and the NANDs 5 is 0.0014 meter. Therefore, a space between the controller 6 and NANDs 5 and the bottom housing 9 is 0.003 meter.

The heat radiation sheet 11 integrally formed to cover the radiating region containing the controller 6 and the NANDs 5 has longitudinal length of 0.05 meter, lateral length of 0.07 meter, and thickness of 0.003 meter.

An area of each of the individual heat radiation sheet 10 is 0.0001 m$^2$ and an area of the heat radiation sheet 11 integrally formed to cover the radiating region containing the controller 6 and the NANDs 5 is 0.0035 m$^2$. Nine individual heat radiation sheets 10 are used in total to correspond to the controller 6 and the NANDs 5, respectively. Therefore, an area ratio of a total area $S_1$ of the individual heat radiation sheet 10 and an area $S_2$ of the heat radiation sheet 11 integrally formed to cover the radiating region containing the controller 6 and the NANDs 5 is $S_1:S_2=0.0009:0.0035 \equiv 1:3.9$.

Coupling capacitance C of the parallel flat capacitor is represented by the following Formula (1):

$$C = \in_0 \times \in \times S_3 \div d \tag{1}$$

In Formula (1), $\in_0$ represents a dielectric constant (F/m) in the vacuum, $\in$ represents a relative dielectric constant of an object present between the parallel flat plates, $S_3$ represents an area (m$^2$) of the parallel flat plates, and d represents a distance (m) between the parallel flat plates.

In the SSD device according to this embodiment, an area of the printed circuit board 3 smaller than the bottom housing 9 is the area of the parallel flat plates: $S_3 = 0.063 \times 0.0865 = 0.0054495$ m$^2$. When the heat radiation sheets 10 or the heat radiation sheet 11 is present in a part between the parallel flat plates, the coupling capacitance of the capacitor is a sum of coupling capacitance of a region where the heat radiation sheets 10 or the heat radiation sheet 11 is present and coupling capacitance of a region where the heat radiation sheets 10 or the heat radiation sheet 11 is not present.

It is assumed that a relative dielectric constant of the air is approximated as 1. For simplification of explanation, it is assumed that a relative dielectric constant of electric components such as the controller 6 and the NANDs 5 is 1.

When the heat radiation sheets 10 or the heat radiation sheet 11 is not used, because only the air is present between the parallel flat plates, from Formula (1), coupling capacitance is $8.85419 \times 10^{-12} \times 1 \times 0.0054495 \div 0.0044 = 1.10 \times 10^{-12}$ F=11.0 pF.

When the individual heat radiation sheets 10 are used, an area of a region where the heat radiation sheets 10 are present is 0.0009 m$^2$ and an area of a region where the heat radiation sheets 10 are not present is 0.0045495 m$^2$. From Formula (1), coupling capacitance of the region where the heat radiation sheets 10 are not present is $8.85419 \times 10^{-12} \times 1 \times 0.0045495 \div 0.0044 = 9.16 \times 10^{-12}$F=9.16 pF.

On the other hand, coupling capacitance of the region where the heat radiation sheets 10 are present is series coupling capacitance of coupling capacitance of sections of the heat radiation sheets and coupling capacitance of sections of the electronic components. Series coupling capacitance $C_c$ of two capacitors $C_A$ and $C_B$ is represented by the following Formula (2):

$$1/C_c = (1/C_A) + (1/C_B) \tag{2}$$

From formula (1), coupling capacitance of sections of the heat radiation sheets 10 is $8.85419 \times 10^{-12} \times 5.8 \times 0.0009 \div 0.003 = 5.9 \times 10^{-12 = 5.69}$ pF. From Formula (1), coupling capacitance of sections of the electronic components is $8.85419 \times 10^{-12} \times 1 \times 0.0009 \div 0.0014 = 1.5 \times 10^{-11}$F=15.4 pF. Therefore, from Formula (2), coupling capacitance of the entire area where the heat radiation sheets 10 are present is 4.16 pF. Therefore, coupling capacitance of the entire capacitors is 9.16 pF+4.16 pF=13.32 pF.

When the heat radiation sheet 11 integrally formed to cover the radiating region containing the controller 6 and the NANDs 5 is used, an area of a region where the heat radiation sheet 11 is present is 0.0035 m² and an area of a region where the heat radiation sheet 11 is not present is 0.0019495 m². According to calculation same as the calculation performed when the individual heat radiation sheet 10 is used, coupling capacitance of the region where the heat radiation sheet 11 is not present is 3.92 pF and coupling capacitance of the region where the heat radiation sheet 11 is present is 16.2 pF. Therefore, coupling capacitance of the entire capacitors is 20.1 pF.

As a result, the coupling capacitance can be reduced by about 44% by using the individual heat radiation sheets 10 compared with the coupling capacitance obtained when the heat radiation sheet 11 integrally formed to cover the radiating region containing the controller 6 and the NANDs 5 is used.

Figure 14:
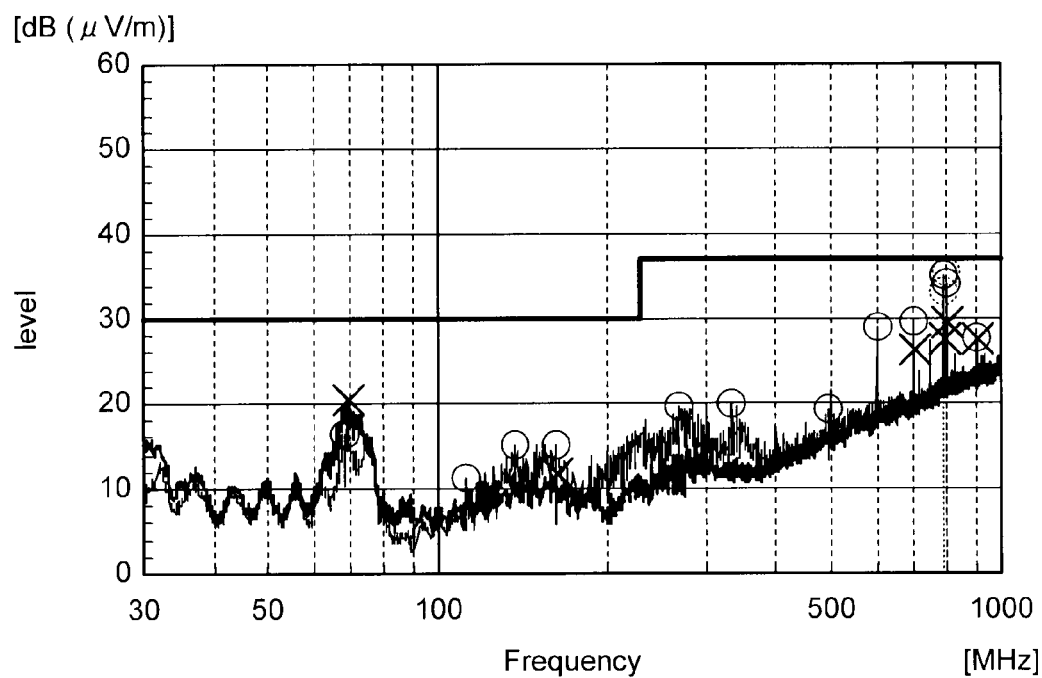
FIG. 14 is a graph of an EMI characteristic of an SSD device including individual heat radiation sheets.
Figure 15:
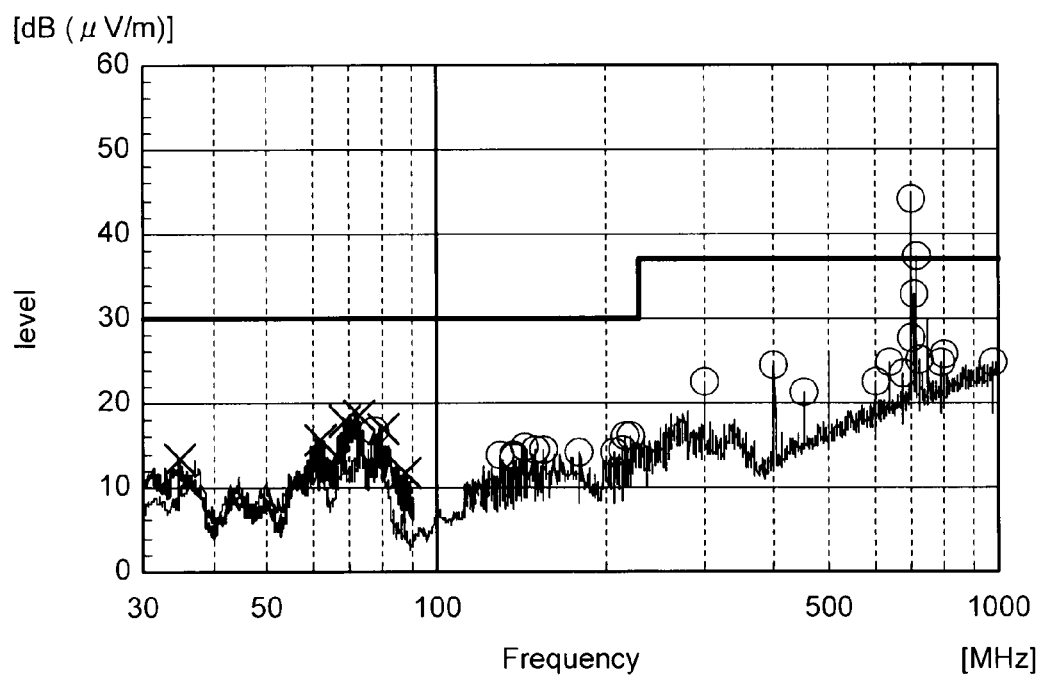
FIG. 15 is a graph of an EMI characteristics of an SSD device using a radiation sheet integrally formed to cover the radiating region containing the controller and NANDs.

An EMI characteristic of the SSD device including the individual heat radiation sheets 10 is shown in FIG. 14. An EMI characteristic of the SSD device including the heat radiation sheet 11 integrally formed to cover the radiating region containing the controller 6 and the NANDs 5 is shown in FIG. 15. Measurement results by a test method specified in the VCCI are shown in the figures. The computer is caused to operate in a state in which the SSD alone connected to the computer by an extension cable is set on the outside of the computer (originally, the computer is caused to operate in a state in which the SSD is incorporated in the computer as the apparatus on which the SSD is mounted). Intensity of an electromagnetic wave (unnecessary radiation) entering an antenna set in a place 10 meters apart from the computer is measured. A condition conforming to the VCCI standard is that the intensity is equal to or lower than 30 decibels in a band of 30 MHz to 230 MHz and is equal to or lower than 37 decibels in a band of 230 MHz to 1000 MHz. In the SSD device including the heat radiation sheet 11 integrally formed to cover the radiating region containing the controller 6 and the NANDs 5, the intensity of the unnecessary radiation is over the standard value near 700 MHz. On the other hand, in the SSD device including the individual heat radiation sheets 10, the intensity of the unnecessary radiation is reduced by about 16 decibels to be equal to or lower than the standard value near 700 MHz.

By using the individualized heat radiation sheets 10, the coupling capacitance of the capacitor is reduced and the unnecessary radiation caused by the bottom housing 9 functioning as the antenna is reduced. To realize, with the heat radiation sheet 11 integrally formed to cover the radiating region containing the controller 6 and the NANDs 5, coupling capacitance equivalent to that of the individual heat radiation sheets 10, it is necessary to form the heat radiation sheet 11 with a material having a relative dielectric constant of 1.586. However, in the present situation, it is difficult to form the heat radiation sheet 11 with such a material. In other words, by using the individualized heat radiation sheets 10, it is possible to reduce the coupling capacitance to a level that cannot be realized when the heat radiation sheet 11 integrally formed to cover the radiating region containing the controller 6 and the NANDs 5 is used and reduce the unnecessary radiation.

By individualizing the heat radiation sheet 10, it is also possible to reduce the weight of the SSD device. When the specific gravity of the heat radiation sheets 10 and 11 is set to 2.7, in the above example, a difference in an area is 0.0026 m² and the thickness of the sheet is 0.003 meter, a weight difference is about 21 grams. In other words, by using the individual heat radiation sheets 10, it is possible to reduce the weight by about 21 grams compared with the SSD device including the heat radiation sheet 11 integrally formed to cover the radiating region containing the controller 6 and the NANDs 5.

Figure 16:
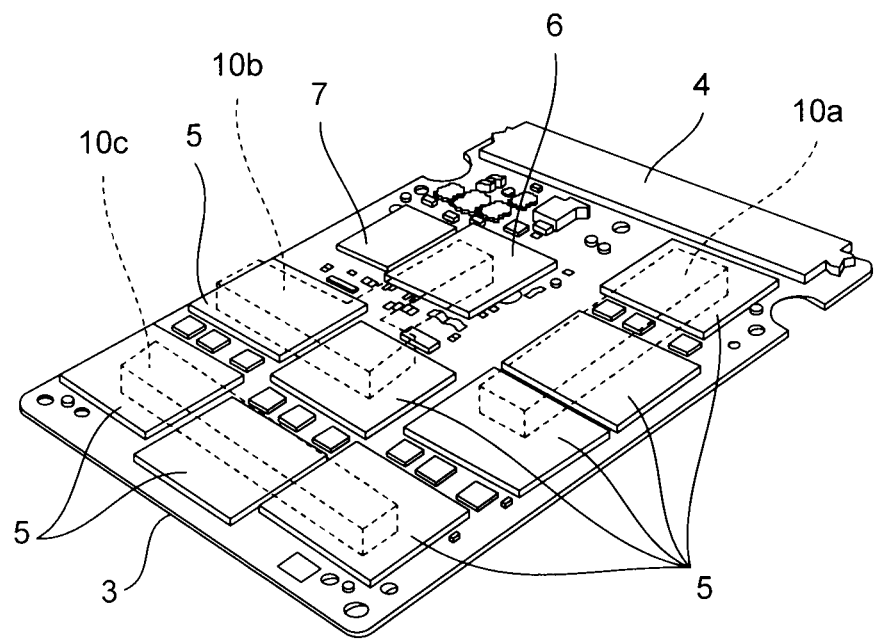
FIG. 16 is a diagram of an example in which one heat radiation sheet is arranged for each of a plurality of cooling targets.

In the example of the configuration explained above, the individual heat radiation sheets 10 are respectively arranged in the controller 6 and the NANDs 5. However, as shown in FIG. 16, one heat radiation sheet can be arranged in each of a plurality of cooling targets. In FIG. 16, each of heat radiation sheets 10a, 10b, and 10c covers three cooling targets (one controller 6 and eight NANDs 5). By adopting such a configuration, it is possible to reduce manhour of work for sticking the heat radiation sheets and improve assembly workability. As the number of cooling targets covered by one heat radiation sheet increases, the assembly workability is higher. On the other hand, the coupling capacitance of the capacitor increases because the heat radiation sheets are arranged in regions where cooling targets are not present. The unnecessary radiation caused by the bottom housing 9 functioning as the antenna increases. In this way, the assembly workability in arranging the heat radiation sheets and the EMI characteristic of the SSD device are in a tradeoff relation.

Therefore, it is advisable to select the number of cooling targets covered by one radiation sheet according to required specifications.

(Second Embodiment)

Figure 17:
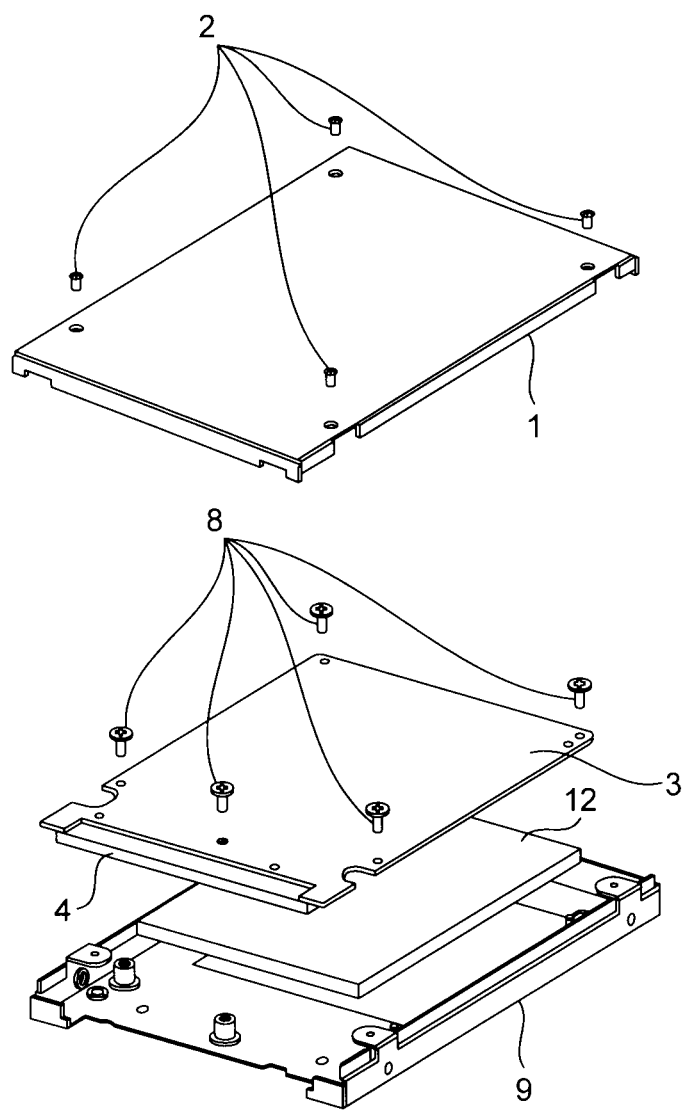
FIG. 17 is a diagram of the configuration of an SSD device according to a second embodiment.

FIG. 17 is a disassembled perspective view of the configuration of an SSD device according to a second embodiment. The configuration of the SSD device according to the second embodiment is the same as the configuration shown in FIG. 12. One heat radiation sheet 12 covers the controller 6 and the eight NANDs 5. The configuration of the lower surface of the printed circuit board 3 of the semiconductor memory device 50 is also the same as that in the first embodiment. However, in this embodiment, the relative dielectric constant of the heat radiation sheet 12 is 3.8, which is lower than that of the heat radiation sheets 10 in the first embodiment.

As it is evident from Formula (1), the coupling capacitance of the parallel flat capacitor is proportional to the relative dielectric constant of an object present between the parallel flat plates. It is assumed that dimensions of the heat radiation sheet 12 are the same as the dimensions of the heat radiation sheet 11 explained in the first embodiment and other conditions such as an area of the printed circuit board 3 and a space between the bottom housing 9 and the printed circuit board 3 are also the same. In this case, as the coupling capacitance of the parallel flat capacitor, according to Formulas (1) and (2), the coupling capacitance of a region where the heat radiation sheet 12 is not present is 3.92 pF and the coupling capacitance of a region where the heat radiation sheet 12 is present is 14.1 pF. Therefore, the coupling capacitance of the entire capacitor is 18.0 pF. Therefore, by applying a heat radiation sheet formed of a material having a low relative dielectric constant, it is possible to reduce the coupling capacitance of the capacitor formed by the printed circuit board and the bottom housing and reduce the unnecessary radiation caused by the bottom housing functioning as the antenna.

(Third Embodiment)

Figure 18:
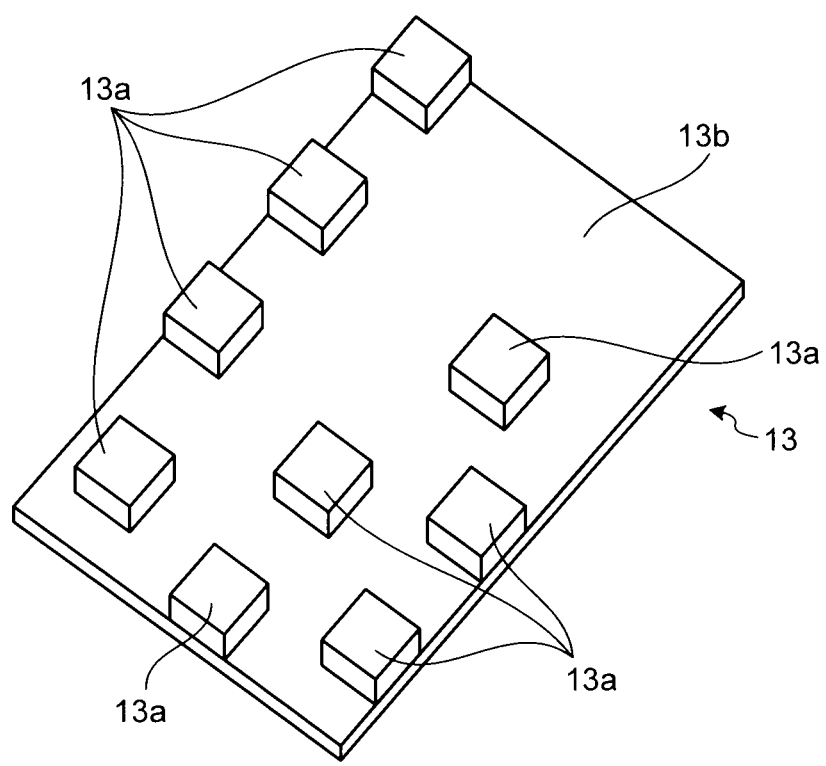
FIG. 18 is a perspective view of heat radiation sheets according to a third embodiment.

In an SSD device according to a third embodiment, as in the second embodiment, one heat radiation sheet covers a controller and eight NANDs. A perspective view of a heat radiation sheet 13 according to this embodiment is shown in FIG. 18. The heat radiation sheet 13 has a structure in which pieces 13a corresponding to cooling targets and a tabular section 13b including the pieces 13a on the surface thereof are integrally molded. By reducing a thickness dimension of the tabular section 13b, it is possible to suppress an increase in coupling capacitance due to the presence of the tabular section 13b between the printed circuit board 3 and the bottom housing 9 compared with an increase in coupling capacitance due to arranging a heat radiation sheet integrally formed to cover the radiating region containing the controller 6 and the NANDs 5. Therefore, in this embodiment, the coupling capacitance of a capacitor can be reduced compared with that in the case of the heat radiation sheet is integrally formed to cover the radiating region containing the controller 6 and the NANDs 5. The heat radiation sheet 13 only has to be stuck once. Therefore, it is possible to realize both an EMI characteristic and assembly workability.

(Fourth Embodiment)

Figure 20A:
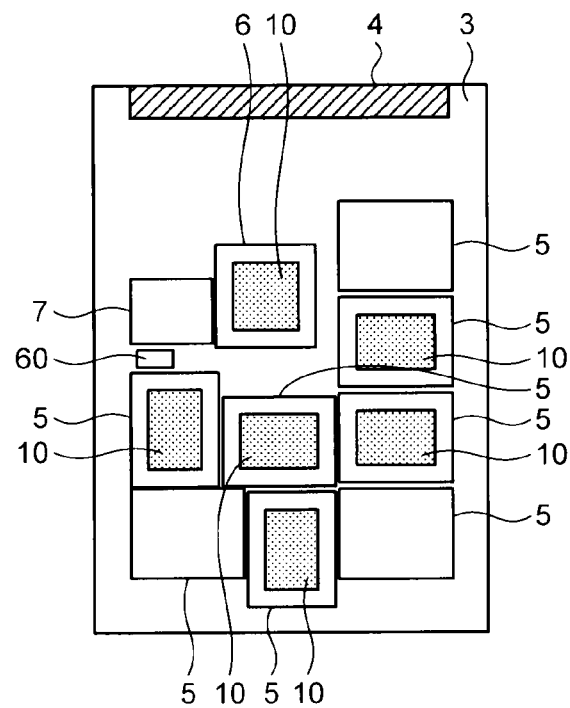
FIGS. 20A and 20B are diagrams illustrating the printed circuit board of the SSD device according to a fourth embodiment.
Figure 20B:
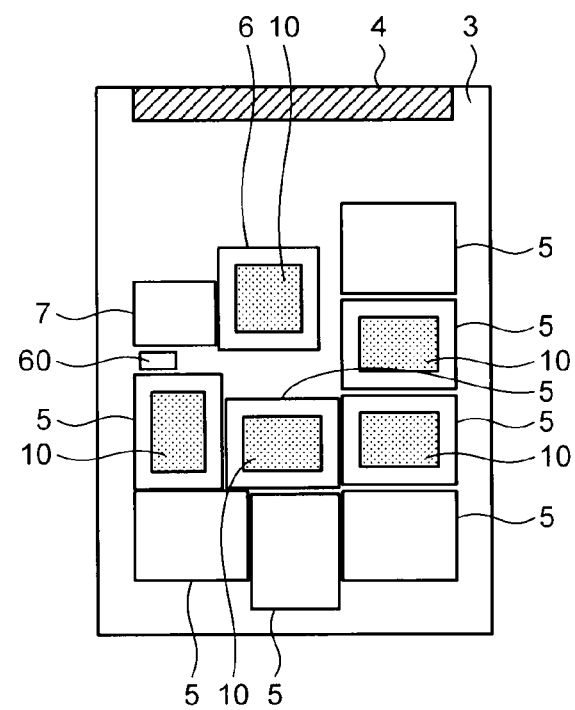

FIGS. 20A and 20B are diagrams illustrating the printed circuit board 3 of the SSD device according to the fourth embodiment. The SSD device according to the present embodiment has, like in the first embodiment, the connector 4, the NANDs 5, the controller 6, and the SDRAM 7 mounted on the printed circuit board 3. Also, the individually-segmented radiation sheets 10 are arranged on the controller 6 and the NANDs 5. In the present embodiment, however, the radiation sheets 10 are arranged on not all of the controller 6 and the NANDs 5, but a portion thereof. FIG. 20A illustrates a configuration in which six sheets of the radiation sheet 10 are arranged and FIG. 20B illustrates a configuration in which five sheets of the radiation sheet 10 are arranged. In both configurations, the radiation sheet 10 is not arranged on the NANDs 5 positioned at corners of a cluster in a substantial rectangular shape of the SDRAM 7, the controller 6, and the NANDs 5 arranged in a rectangular cluster.

The printed circuit board 3 has a temperature sensor IC 60 having a function to output temperature measurement results mounted thereon.

Figures 21A, 21B:
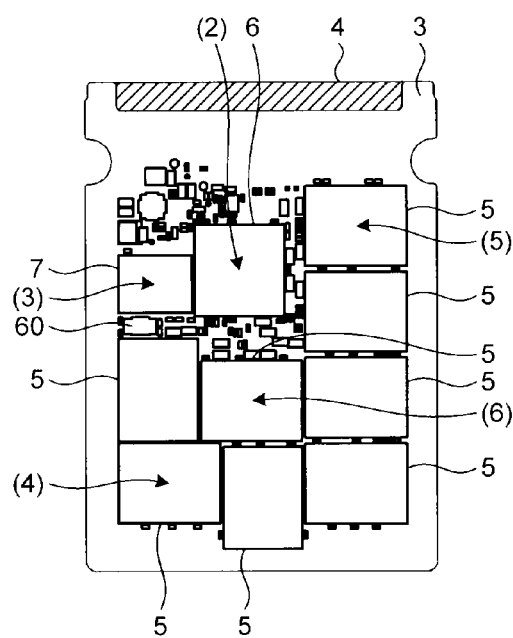
FIG. 21A is a diagram illustrating temperature measurement results when a SSD device according to the fourth embodiment is caused to continuously write data at the transfer rate of 192 MB/sec.
FIG. 21B is a diagram illustrating temperature measurement locations on each component mounted on a printed circuit board.

FIG. 21A is a diagram illustrating temperature measurement results (Celsius temperature) when an SSD device according to the present embodiment is caused to continuously write data at the transfer rate of 192 MB/sec at room temperature in an atmosphere of no wind. FIG. 21B is a diagram illustrating temperature measurement locations on each device mounted on the printed circuit board 3. No. 2 to No. 6 measurement locations in FIG. 21A are locations indicated by arrows of (2) to (6) in FIG. 21B. No. 1 measurement location in FIG. 21A is an atmosphere in which the SSD device is installed and No. 7 measurement location is a surface of the housing on the side of the controller 6. Temperature measurement results at each location when, as illustrated in FIG. 12, the SSD device is caused to continuously write data at 192 MB/sec by covering a substantially entire surface of the printed circuit board 3 with one radiation sheet, temperature measurement results at each location when the SSD device is caused to continuously write data at 189 MB/sec with no radiation sheet, and temperature measurement results at each location when the SSD device is caused to continuously write data at 192 MB/sec by arranging the radiation sheet 10 on all of the controller 6 and the NANDs 5 are illustrated for comparison. A thermocouple is used for temperature measurement. Further, measurement results by the temperature sensor IC 60 are also illustrated together with temperature measurement results at each location. Regarding each configuration in which a radiation sheet is provided, measurement results by the thermocouple on each device mounted on the printed circuit board 3 and measurement results by the temperature sensor IC 60 are values close to each other, which illustrates that measurement results by the temperature sensor IC 60 are reliable.

The temperature of the controller 6 is lower when the number of the radiation sheets 10 is six (6 pcs) than when the number of the radiation sheets 10 is five (5 pcs). The temperature of the controller 6 when the number of the radiation sheets 10 is nine (9 pcs) is approximately the same as the temperature of the controller 6 when the number of the radiation sheets 10 is six (6 pcs). The temperature of the NAND 5 is approximately the same when the number of the radiation sheets 10 is five and the number of the radiation sheets 10 is six. The temperature of the NAND 5 when the number of the radiation sheets 10 is nine is further lower than the temperature of the NAND 5 when the number of the radiation sheets 10 is six.

It is assumed here that the temperature of each device should be 85° C. or less when the temperature of the housing is set to 70° C. and an increase in temperature at each location will be calculated based on temperature measurement results illustrated in FIG. 21A. (Calculate temperature differences from the temperature of the housing) FIG. 22 is a diagram illustrating temperature differences between each device mounted on the printed circuit board 3 and the housing and maximum temperatures of devices when the housing temperature is assumed to be 70° C. In all configurations in which the number of the radiation sheets 10 is five, six, and nine, the maximum value of temperature difference between the housing and each device (the SDRAM 7, the controller 6, and the NAND 5) is less than 15° C. and thus, if the temperature of the housing is set to 70° C., the temperature of all devices is less than 85° C. so that it is possible to verify that requirements concerning the device temperature can be met.

The configuration in which the number of the radiation sheets 10 is five is lighter and costs less, but the temperature difference from the temperature of the housing is large. Though the configuration in which the number of the radiation sheets 10 is six is heavier than the configuration in which the number of the radiation sheets 10 is five, the temperature difference from the temperature of the housing becomes smaller. Thus, the number of the radiation sheets 10 can be decided as appropriate by considering the weight, cost, and the magnitude of temperature difference from the temperature of the housing within the range in which a product meets requirements concerning the device temperature. Therefore, heat dissipation performance can be ensured while reducing the weight and material costs by arranging the radiation sheets 10 on a portion of the controller 6 and the NANDs 5.

In the configuration explained as the example in the embodiments, the controller 6 and the NANDs 5 are mounted on the lower surface of the printed circuit board 3 and the heat radiation sheets 10, the heat radiation sheet 12, or the heat radiation sheet 13 is arranged between the printed circuit board 3 and the bottom housing 9. However, it goes without saying that the same effect can be obtained even when the controller 6 and the NANDs 5 are mounted on the upper surface of the printed circuit board 3 and a heat radiation sheet(s) is arranged between the printed circuit board 3 and the top cover 1.

Figure 19:
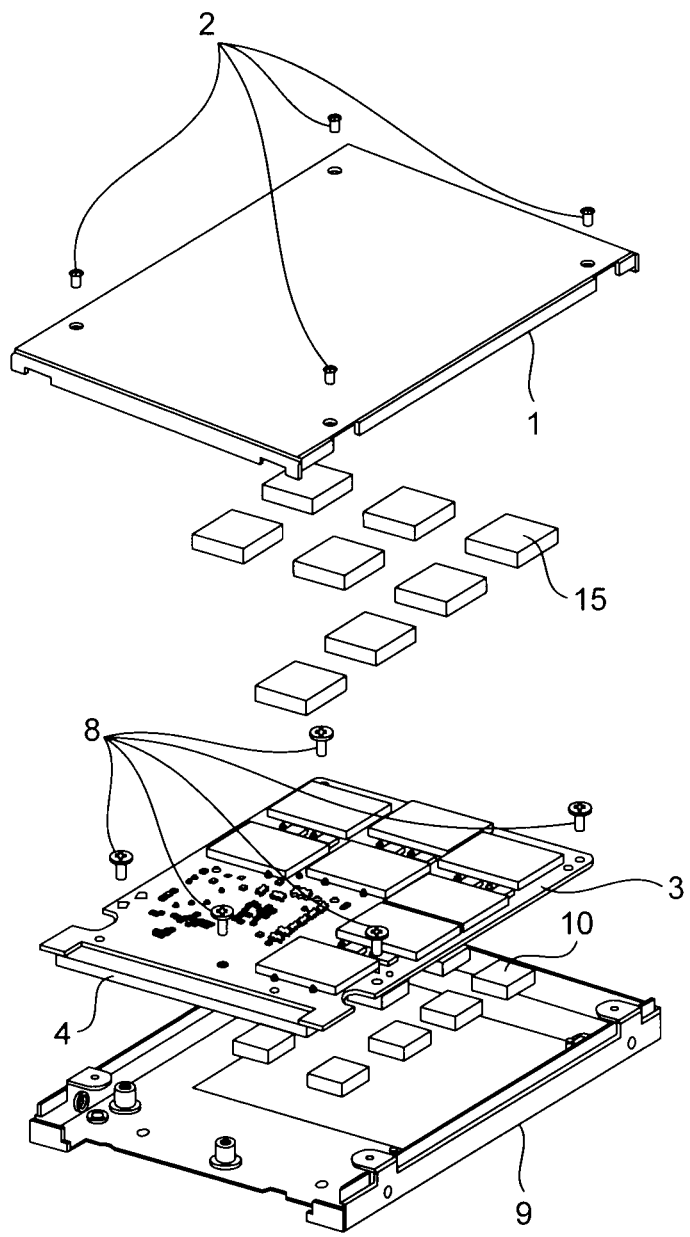
FIG. 19 is a diagram of the configuration of an SSD device including a printed circuit board mounted with NANDs on both sides thereof and the configuration of a lower surface of the printed circuit board mounted with the NANDs on both the sides.

In the configuration explained as the example in the embodiments, the NANDs 5 are mounted on only the lower surface of the printed circuit board 2. However, it is also possible to adopt a configuration in which the printed circuit board 3 mounted with the NANDs 5 on both the surfaces is used. FIG. 19 is a disassembled perspective view of the configuration of an SSD device including the printed circuit board 3 mounted with the NANDs 5 on both the surfaces. The configuration of the lower surface of the printed circuit board 3 of the semiconductor memory device 50 is the same as that shown in FIG. 1B. When the printed circuit board 3 mounted with the NANDs 5 on both the surfaces is used, individual heat radiation sheets 15 (second heat radiation members) same as the heat radiation sheets 10 in the first embodiment are arranged between the NANDs 5 as second nonvolatile semiconductor memories on the upper surface side of the printed circuit board 3 and the top cover 1. This makes it possible the coupling capacitance of a parallel flat capacitor formed by the printed circuit board 3 and the top cover 1 is smaller than the coupling capacitance when an integrally formed object having a relative dielectric constant of 5.8 is arranged between the capacitor to cover a radiating region (second radiating region) containing the second nonvolatile semiconductor memories on the upper surface side of the printed circuit board 3 and reduce unnecessary radiation caused by the top cover 1 functioning as an antenna. It goes without saying that the same effect can be obtained even if the heat radiation sheets 15 are the same as those in the second, third and fourth embodiments. It goes without saying that, like the first heat radiation member, the second heat radiation member can be a gel member.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the sprit of the inventions. The accompanying claims and their equivalents are intended to cover such forms or modifications as would fall within the scope and spirit of the inventions.

What is claimed is:

1. A semiconductor storage device comprising:
    a printed circuit board mounted with, on one surface, respectively via a plurality of bumps, a plurality of first nonvolatile semiconductor memories and a controller that controls reading of data from and writing of data in the first nonvolatile semiconductor memories;
    a housing that is formed of a conductive material and houses the printed circuit board; and
    a first heat radiation member that is interposed between a surface of the housing opposed to one surface of the printed circuit board and the controller and first nonvolatile semiconductor memories and thermally connects the controller and first nonvolatile semiconductor memories and the housing, wherein
    coupling capacitance in a state in which the first heat radiation member is arranged between a first capacitor formed by the surface of the housing opposed to one surface of the printed circuit board and the printed circuit board is smaller than coupling capacitance in a state in which an integrally formed object having a relative dielectric constant of 5.8 is arranged between the first capacitor to cover a first radiating region containing the controller and the first nonvolatile semiconductor memories.

2. A storage device comprising:
    a plurality of first nonvolatile semiconductor memories;
    a controller coupled to the plurality of first nonvolatile semiconductor memories;
    a printed circuit board, wherein the first nonvolatile semiconductor memories and the controller are mounted on one surface of the printed circuit board,
    a housing made of a conductive material and faces the printed circuit board; and
    a first heat radiation sheet interposed between a surface of the housing opposed to the one surface of the printed circuit board and the controller and plurality of first nonvolatile semiconductor memories, wherein the first heat radiation sheet thermally connects the controller and plurality of first nonvolatile semiconductor memories with the housing, wherein
    the first heat radiation sheet is divided into a plurality of pieces and the divided pieces of the first heat radiation sheet are arranged at intervals to suppress an increase in the coupling capacitance of the device or to suppress thermal cross talk with each other.

3. The storage device according to claim 2, wherein the divided pieces of the first heat radiation sheet are arranged to respectively correspond to the controller and the first nonvolatile semiconductor memories.

4. The storage device according to claim 2, wherein at least one of the divided pieces of the first heat radiation sheet is arranged over two or more of the controller and the first nonvolatile semiconductor memories.

5. The storage device according to claim 2, wherein
    the first heat radiation sheet has the divided pieces and a tabular section including the divided pieces on a surface thereof, and
    the divided pieces and the tabular section are integrally molded.

6. The storage device according to claim 2, wherein the first heat radiation sheet is obtained by setting a fluid injected into a surface of the housing opposed to one surface of the printed circuit board.

7. The storage device according to claim 2, wherein the first heat radiation sheet has flexibility and is closely attached to the surface of the housing opposed to one surface of the printed circuit board, the controller, and the first nonvolatile semiconductor memories.

8. The storage device according to claim 2, further comprising:
    a plurality of second nonvolatile semiconductor memories, reading of data from and writing of data in which are controlled by the controller, mounted on the other surface of the printed circuit board, and
    a second heat radiation sheet interposed between the second nonvolatile semiconductor memories and an inner surface of the housing opposed to the other surface of the printed circuit board, wherein the second heat radiation member is configured to and thermally connects the second nonvolatile semiconductor memories with the housing, and
    wherein the second heat radiation sheet is divided into a plurality of pieces and the divided pieces of the second heat radiation sheet are arranged at intervals.

9. The storage device according to claim 8, wherein the divided pieces of the second heat radiation sheet are arranged to respectively correspond to the second nonvolatile semiconductor memories.

10. The storage device according to claim 8, wherein at least one of the divided pieces of the second heat radiation sheet is arranged over two or more of the second nonvolatile semiconductor memories.

11. The storage device according to claim 8, wherein
    the second heat radiation sheet has the divided pieces and a tabular section including the divided pieces on a surface thereof, and
    the divided pieces and the tabular section are integrally molded.

12. The storage device according to claim 8, wherein the second heat radiation sheet is obtained by setting a fluid injected into a surface of the housing opposed to the other surface of the printed circuit board.

13. The storage device according to claim 8, wherein the second heat radiation sheet has flexibility and is closely attached to the surface of the housing opposed to the other surface of the printed circuit board and the second nonvolatile semiconductor memories.

14. The storage device according to claim 2, wherein each piece of the first heat radiation sheet divided into the plurality of pieces is arranged corresponding to a portion of the controller and the first nonvolatile semiconductor memories.

15. The storage device according to claim 14, wherein the controller and the plurality of first nonvolatile semiconductor memories are mounted on the one side of the printed circuit board as a cluster in a substantially rectangular shape; and
  the first heat radiation sheet is not arranged on the first nonvolatile semiconductor memories positioned at corners of the cluster in the substantially rectangular shape.

16. The storage device according to claim 8, wherein each piece of the second heat radiation sheet divided into the plurality of pieces is arranged corresponding to a portion of the second nonvolatile semiconductor memories.

\* \* \* \* \*